United States Patent
Zhang et al.

(10) Patent No.: US 10,665,151 B2
(45) Date of Patent: May 26, 2020

(54) DRIVER CIRCUIT CARRIER, DISPLAY PANEL, TABLET DISPLAY, AND MANUFACTURING METHOD

(71) Applicants: KUNSHAN NEW FLAT PANEL DISPLAY TECHNOLOGY CENTER CO., LTD., Jiangsu (CN); KUNSHAN GO-VISIONOX OPTO-ELECTRONICS CO., LTD., Jiangsu (CN)

(72) Inventors: Xiuyu Zhang, Jiangsu (CN); Xiaofei Xue, Jiangsu (CN); Tao Xu, Jiangsu (CN); Xiangqian Wang, Jiangsu (CN); Zhan Sun, Jiangsu (CN)

(73) Assignees: KUNSHAN NEW FLAT PANEL DISPLAY TECHNOLOGY CENTER CO., LTD., Kunshan, Jiangsu (CN); KUNSHAN GO-VISIONOX OPTO-ELECTRONICS CO., LTD., Kunshan, Jiangsu (CN)

( * ) Notice: Subject to any disclaimer, the term of this patent is extended or adjusted under 35 U.S.C. 154(b) by 0 days.

(21) Appl. No.: 16/306,830

(22) PCT Filed: Oct. 30, 2017

(86) PCT No.: PCT/CN2017/108258
§ 371 (c)(1),
(2) Date: Dec. 3, 2018

(87) PCT Pub. No.: WO2018/077257
PCT Pub. Date: May 3, 2018

(65) Prior Publication Data
US 2019/0139481 A1 May 9, 2019

(30) Foreign Application Priority Data

Oct. 31, 2016 (CN) .......................... 2016 1 0939160
Jul. 17, 2017 (CN) .......................... 2017 1 0581980

(51) Int. Cl.
*G09G 3/20* (2006.01)
*H05K 7/10* (2006.01)
(Continued)

(52) U.S. Cl.
CPC ....... *G09G 3/2096* (2013.01); *G02F 1/13452* (2013.01); *H05K 7/1084* (2013.01);
(Continued)

(58) Field of Classification Search
CPC ........ G09G 3/20; G09G 9/301; G09G 3/2096; G09G 2300/0408; G09G 2310/0264; H05K 7/1084; G02F 1/13; H01L 27/32
See application file for complete search history.

(56) References Cited

U.S. PATENT DOCUMENTS 5,951,304 A * 9/1999 Wildes .................. B81B 7/0006
174/261
10,242,605 B2 * 3/2019 Chen ..................... H05K 13/046
(Continued)

FOREIGN PATENT DOCUMENTS

CN 101089924 A 12/2007
CN 101800238 A 8/2010
(Continued)

OTHER PUBLICATIONS

JP Office Action dated Mar. 26, 2020 in JP Application No. 2018-563601.

*Primary Examiner* — Daniel P Wicklund
*Assistant Examiner* — Sagar Shrestha
(74) *Attorney, Agent, or Firm* — Muncy, Geissler, Olds & Lowe, P.C.

(57) ABSTRACT

A driver circuit carrier, a display panel, and a manufacturing method are provided. The driver circuit carrier includes a substrate, and a number of first pins arranged on at least one surface of the substrate. The first pins are arranged along a
(Continued)

first reference line. An imaginary extending line of at least one of the first pins intersects with a second reference line perpendicular to the first reference line.

15 Claims, 11 Drawing Sheets

(51) Int. Cl.
*G02F 1/1345* (2006.01)
*H05K 1/11* (2006.01)
*H05K 3/00* (2006.01)

(52) U.S. Cl.
CPC ............... *G09G 2300/0408* (2013.01); *G09G 2310/0264* (2013.01); *H05K 1/11* (2013.01); *H05K 3/00* (2013.01)

(56) References Cited

U.S. PATENT DOCUMENTS

| | | | |
|---|---|---|---|
| 2006/0267971 A1* | 11/2006 | Yoo | C25D 5/02 345/206 |
| 2014/0321088 A1* | 10/2014 | Bae | H05K 1/117 361/767 |
| 2015/0103500 A1* | 4/2015 | Bae | H01L 24/06 361/749 |
| 2015/0201492 A1 | 7/2015 | Kim et al. | |
| 2015/0366049 A1 | 12/2015 | Lee | |
| 2016/0104692 A1 | 4/2016 | Lee et al. | |
| 2018/0047314 A1* | 2/2018 | Chen | H05K 13/046 |
| 2018/0047315 A1* | 2/2018 | Li | H01L 23/488 |
| 2018/0122758 A1 | 5/2018 | Chen et al. | |
| 2019/0198473 A1* | 6/2019 | Li | H01L 24/14 |

FOREIGN PATENT DOCUMENTS

| | | |
|---|---|---|
| CN | 103187385 A | 7/2013 |
| CN | 104123902 A | 10/2014 |
| CN | 105259718 A | 1/2016 |
| CN | 105513499 A | 4/2016 |
| CN | 105551378 A | 5/2016 |
| CN | 105609007 A | 5/2016 |
| CN | 105654856 A | 6/2016 |
| CN | 105720028 A | 6/2016 |
| CN | 205376526 U | 7/2016 |
| CN | 106298862 A | 1/2017 |
| EP | 3040964 A1 | 7/2016 |
| JP | H11112119 A | 4/1999 |
| JP | 2005136257 A | 5/2005 |
| JP | 2007019550 A | 1/2007 |
| JP | 2009288276 A | 12/2009 |
| JP | 2015204458 A | 11/2015 |
| KR | 1020160043571 A | 4/2016 |
| TW | I390280 B1 | 3/2013 |
| TW | I531835 B | 5/2016 |

* cited by examiner

DRIVER CIRCUIT CARRIER, DISPLAY PANEL, TABLET DISPLAY, AND MANUFACTURING METHOD

TECHNICAL FIELD

The present invention relates to the field of display technology and, in particular, to a driver circuit carrier, a display panel, a flat panel display device and a method for manufacturing the device.

BACKGROUND

A flat panel display device typically includes a display panel and a driver circuit that is electrically connected to the display panel for its display control. Conventional methods that can accomplish the electrical connection of the driver circuit to the display panel include COF (chip-on-flex or chip-on-film) and COG (chip-on-glass) techniques. In a COG technique, a driver circuit is usually embodied in a driver chip which is directly connected to a display panel and hence allows electrical connection between the driver circuit and the display panel. In a COF technique, a driver circuit is typically fabricated on a thin film substrate which is directly connected to a display panel and thus enables electrical connection between the driver circuit and the display panel.

In the COG technique, the driver chip serves as a carrier that carries the driver circuit and is configured for connection to the display panel. The driver chip is provided with pins (also called leads or output pads) which can be bonded to pins (also called leads or output pads) on the display panel to establish the electrical connection between the driver circuit and the display panel. In the COF technique, the thin film substrate serves as a carrier that carries the driver circuit and is configured for electrical connection to the display panel, and the electrical connection can be accomplished by bonding pins on the thin film substrate to pins on the display panel. Therefore, it is critical to bond the pins on the driver circuit carrier to the pins on the display panel with high quality.

SUMMARY OF THE INVENTION

It is an object of the present invention to provide a driver circuit carrier, a display panel, a flat panel display device and a method for manufacturing the device, in which pins on the driver circuit carrier can be bonded to pins on the display panel with improved quality.

To solve the above technical problem, the present invention provides a driver circuit carrier including a substrate and a plurality of first pins on at least one surface of the substrate. The first pins are arranged along a first reference line, and an imaginary extending line of at least one of the first pins intersects with a second reference line that is perpendicular to the first reference line.

The present invention also provides a display panel including a non-display area in which there is a plurality of second pins arranged along a third reference line. An imaginary extending line of at least one of the second pins intersects with a fourth reference line that is perpendicular to the third reference line.

The present invention also provides a flat panel display device including the driver circuit carrier as defined above and the display panel as defined above. The first pins in the driver circuit carrier are fully or partially bonded to the second pins in the display panel so that the second reference line coincides with the fourth reference line.

The present invention also provides a method for manufacturing a flat panel display device. The method includes: providing the driver circuit carrier as defined above; providing the display panel as defined above; aligning the first pins in the driver circuit carrier with the second pins in the display panel using first alignment marks in the driver circuit carrier and second alignment marks in the display panel; and attaching the first pins to the second pins so that the driver circuit carrier is bonded to the display panel.

In the driver circuit carrier, the display panel, the flat panel display device and the method for manufacturing the device of the present invention, the first pins in the driver circuit carrier are designed to enable maximum compliance with the properties of the substrate and effective compensation for bonding errors from tensile deformation of the substrate. With the second pins in the display panel that are provided in correspondence with the first pins in the driver circuit carrier, significantly improved bonding quality can be achieved even after the display panel or the driver circuit carrier has experienced an expansion.

DETAILED DESCRIPTION

Figure 1:
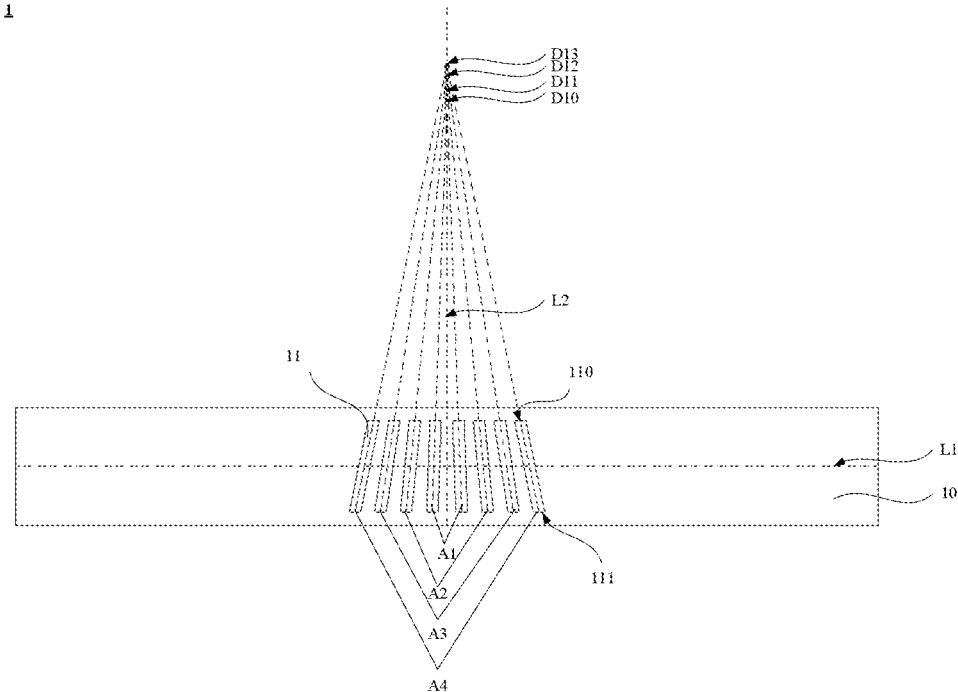
FIGS. 1, 3, 5, 7, 9, 11, 13, 15, 17, 19, 21 and 23 are structural schematics of driver circuit carriers according to Embodiments 1 to 11 of the present invention.

The driver circuit carrier, the display panel, the flat panel display device and the method for manufacturing the device proposed in the present invention will be described in greater detail below with reference to specific embodiments which are to be read in conjunction with the accompanying drawings. Features and advantages of the invention will be more readily apparent from the following detailed description and claims. It is noted that the drawings are presented in a very simplified form not necessarily presented to scale, with the only intention to facilitate convenience and clarity in explaining the embodiments.

Pins in conventional driver circuit carriers and display panels are generally rectangular and arranged parallel to one another. In addition, when a conventional flexible or bendable driving circuit carrier is undergoing a hot press process, its substrate (e.g., a flexible medium surrounding the pins) tends to experience an expansion under the influence of a high temperature in the process, which may lead to imprecise alignment between pins of the driver circuit carrier and pins of the display panel, even though the pins are designed to have the same process parameters (e.g., width, pitch, etc.), and thus the bonding quality is impaired.

The core idea of the present invention is to provide a driver circuit carrier, comprising a substrate and a plurality of first pins arranged on at least one surface of the substrate. The plurality of first pins are all arranged along a first reference line, and an imaginary extending line of at least one of the first pins intersects with a second reference line that is perpendicular to the first reference line. That is, in the plurality of first pins, at least one of the first pins, preferably at least half of them, more preferably all of them excluding one or several in the vicinity of the second reference line are inclined (i.e., not perpendicular) with respect to the first reference line. As such, each slanted first pin is spaced apart from a neighboring first pin by a distance that varies at different positions. That is, spacing between a slanted first pin and its neighboring first pin varies from one end of the first pin close to the intersection to the other end of the first pin away from the intersection. Here, the spacing refers to a distance between midpoints (along a direction of the first reference line) of two adjacent first pins. With this design, the driver circuit carrier is more resilient against alignment errors occurring due to substrate expansion. In other words, compared to traditional driver circuit carriers, the first pins in the driver circuit carrier of the present invention can be more sufficiently attached to the second pins in a display panel even after the substrate of the driver circuit carrier has experienced an expansion.

In addition, each of the first pins comprises a first end and a second end opposing the first end and may have a cross-sectional width that is greater at the first end than at the second end. This enables increased contact areas between the first pins in the driver circuit carrier and the second pins in the display panel along the first reference line at the time of moving the driver circuit carrier along the second reference line to compensate an offset along the first reference line. In this manner, attachment quality between the first pins in the driver circuit carrier and the second pins in the display panel, as well as the bonding strength between the driver circuit carrier and the display panel, could be improved.

Further, first alignment marks may be provided on the outermost ones of the first pins, which serve as references to allow faster attachment of the first pins in the driver circuit carrier to the second pins in the display panel with higher accuracy.

In the present invention, there is also provided a corresponding display panel including a non-display area in which there is a plurality of second pins arranged along a third reference line. Wherein, an imaginary extending line of at least one of the second pins intersects with a fourth reference line that is perpendicular to the third reference line.

In the present invention, the second pins in the display panel are provided in correspondence with the first pins in the driver circuit carrier. Specifically, an angle and a direction of inclination for each second pin with respect to the third reference line are as same as those for each corresponding first pin with respect to the first reference line; a shape and a cross-sectional width of each second pin are identical to those of each corresponding first pin; the spacing between adjacent second pins is identical to the spacing between corresponding adjacent first pins; and so on.

According to the present invention, a first end of each of the first pins arranged along the first reference line faces toward the display panel, and a first end of each of the second pins arranged along the third reference line faces toward the driver circuit carrier. When the driver circuit carrier is fully bonded to the display panel, the first end of each first pin faces toward/is close to the second end of the corresponding second pin, while the second end of each first pin faces toward/is close to the first end of the corresponding second pin.

In the present invention, there is also provided a flat panel display device and a method of manufacturing the device. The method includes: providing the driver circuit carrier; providing the display panel; aligning the first pins in the driver circuit carrier with the second pins in the display panel using the first alignment marks in the driver circuit carrier and the second alignment marks in the display panel; and attaching the first pins to the second pins so that the driver circuit carrier is bonded to the display panel.

Further, according to the present invention, the driver circuit carrier may be a thin-film substrate, a driver chip or another structure carrying a driver circuit. The display panel may be a rigid display panel, a flexible display panel, etc.

In the following description, the driver circuit carrier, the display panel, the flat panel display device, bonding equipment and method proposed in the present invention will be further described with reference to the accompanying drawings and a few specific embodiments. It is noted that, for the sake of clarity, only several first pins/second pins are schematically illustrated in the figures, but in practice, actual products typically contain hundreds or even thousands of first pins/second pins. Further, the drawings are all of a schematic nature, and for the sake of clarity, angles drawn therein tend to deviate from their actually intended value.

Embodiment 1

Driver Circuit Carrier: Reference is now made to FIG. 1, a structural schematic of a driver circuit carrier according to Embodiment 1 of the present invention. As shown in FIG. 1, in this Embodiment, the driver circuit carrier 1 comprises a substrate 10 and a plurality of first pins 11 arranged on at least one surface of the substrate 10. All the first pins 11 are arranged along a first reference line L1. An imaginary extending line of at least one of the first pins 11 intersects with a second reference line L2 perpendicular to the first reference line L1.

In this Embodiment, each of the first pins 11 is bisected, along the second reference line L2, by the first reference line L1 into two halves. In this Embodiment, the number of all the first pins 11 is even, and the second reference line L2 situates between the two middlemost ones of the first pins 11. Further, the second reference line L2 situates in a middle position of the substrate 10.

With continued reference to FIG. 1, in this Embodiment, an overall shape of the layout for all the first pins 11 appears like an isosceles trapezoid which has an upper (shorter) base facing a display panel. In other words, after the driver circuit carrier 1 is bonded to the display panel, the upper base of the isosceles trapezoid is closer to a display area of the display panel. Here, each first pin 11 has a first end 110 close to the display panel and a second end 111 away from the display panel.

In this Embodiment, all of the first pins 11 have same cross-sectional width along the direction of the first reference line L1. That is, all of the first pins 11 have same constant cross-sectional width from the first end 110 to the second end 111. Additionally, a shape of each first pin 11 is rectangle or parallelogram. Each first pin 11 has a pair of first sides and a pair of second sides. Each first side (or its imaginary extending line) intersects with the first reference line L1, while each second side is parallel to the first reference line L1. That is, here, the long sides of the rectangles or parallelograms intersect with the first reference line L1, while their short sides are parallel to the first reference line L1.

With continued reference to FIG. 1, in this Embodiment, there are eight first pins 11 divided into four first-pin groups, each containing two of them. Here, the four first-pin groups are indicated respectively at A1, A2, A3 and A4.

In this Embodiment, the imaginary extending line of each of the four first-pin groups intersects with the second reference line L2. In addition, the imaginary extending lines of all the (here, the two) first pins 11 in each first-pin group intersect with the second reference line L2 at a same point, and the imaginary extending lines of different first-pin groups intersect the second reference line L2 at different points. That is, the imaginary extending lines of the two first pins 11 in the first-pin group A1 intersect the second reference line L2 both at a point D10, the imaginary extending lines of the two first pins 11 in the first-pin group A2 intersect with the second reference line L2 both at a point D11, the imaginary extending lines of the two first pins 11 in the first-pin group A3 intersect with the second reference line L2 both at a point D12 and the imaginary extending lines of the two first pins 11 in the first-pin group A4 intersect with the second reference line L2 both at a point D13.

Further, all the first pins 11 in each of the first-pin groups are arranged symmetrically on both sides of the second reference line L2. That is, the two first pins 11 in the first-pin group A1 are arranged symmetrically with respect to the second reference line L2, the two first pins 11 in the first-pin group A2 are arranged symmetrically with respect to the second reference line L2, the two first pins 11 in the first-pin group A3 are arranged symmetrically with respect to the second reference line L2, and the two first pins 11 in the first-pin group A4 are arranged symmetrically with respect to the second reference line L2. In other embodiments, all the first pins 11 in a certain one of the first-pin groups may be arranged on both sides of the second reference line L2 in an asymmetric style.

Typically, the substrate. 10 has a same/similar material property at its symmetrical locations. In other words, any two symmetrical locations of the substrate 10 are apt to expand or not simultaneously. For this reason, preferably, all the first pins 11 in each of the first-pin groups are arranged symmetrically on both sides of the second reference line L2. This enables better compliance with the characteristics of the substrate 10 and better compensation for expansion/tension-caused deformation.

Preferably, among all the first pins 11, the one being farthest from the second reference line L2 and having its imaginary extending line intersecting with the second reference line L2 has an angle of 5° to 15° formed between its imaginary extending line and the second reference line L2. Further, for one of the first-pin groups having its imaginary extending line intersecting with the second reference line L2, the distance from the intersection to a distal end of the one of the first pins 11 in the first-pin group farthest from the second reference line L2 satisfies:

$$R_1 = 360 \times W_1 \times M_1 / (\pi \times \theta_1)$$

where, the distal end refers to the end of the first pin 11 farther from the intersection, $R_1$ represents the distance from the intersection to the distal end of the first pin 11 farthest from the second reference line L2, $W_1$ denotes the cross-sectional width of the first pin 11 (which may either be a cross-sectional width taken along the first reference line L1 or an average cross-sectional width of the first pin taken in the direction of the first reference line L1), $M_1$ is the number of the first pins 11, $\pi$ is a constant, and $\theta_1$ is the angle between the imaginary extending line of the first pin 11 farthest from the second reference line L2 and the second reference line L2.

Figure 2:
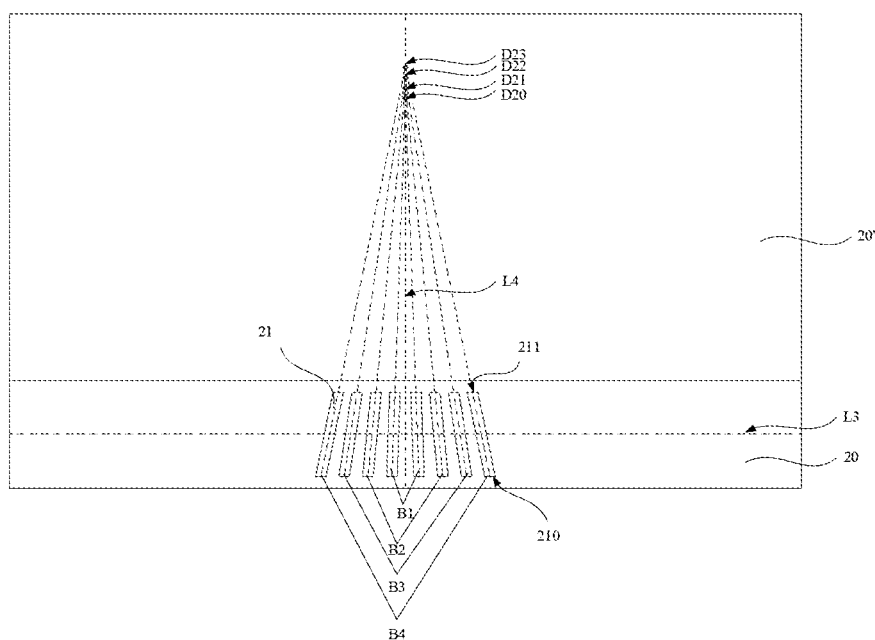
FIGS. 2, 4, 6, 8, 10, 12, 14, 16, 18, 20, 22 and 24 are structural schematics of display panels according to Embodiments 1 to 11 of the present invention.

Display Panel: In this Embodiment, there is also provided a corresponding display panel. Specifically, reference is now made to FIG. 2, a structural schematic of the display panel according to Embodiment 1. As shown in FIG. 2, the display panel 2 comprises a non-display area 20 in which there are a plurality of second pins 21 arranged along a third reference line L3. An imaginary extending line of at least one of the second pins 21 intersects with a fourth reference line L4 perpendicular to the third reference line L3. Here, the second pins 21 are provided in correspondence with the first pins 11.

Specifically, each of the second pins 21 is bisected, along the direction of the fourth reference line L4, by the third reference line L3 into two halves. In this Embodiment, the number of all of the second pins 21 is even, and the fourth reference line L4 situates between two middlemost ones of the second pins 21. Further, the fourth reference line L4 situates in a middle position of the non-display area 20.

With continued reference to FIG. 2, in this Embodiment, an overall shape of the layout for all the second pins 21 appears like an isosceles trapezoid which has a lower (longer) base facing the driver circuit carrier 1. In other words, the upper base of the isosceles trapezoid is closer to the display area 20' of the display panel 2. Here, each second pin 21 has a first end 210 away from the display area 20' and a second end 211 close to the display area 20'.

In this Embodiment, all of the second pins 21 have same cross-sectional width along the direction of the third reference line L3. That is, every second pin 21 has same constant cross-sectional width from the first end 210 to the second end 211. Additionally, a shape of each second pin 21 is rectangle or parallelogram. Each of the second pins 21 has a pair of third sides and a pair of fourth sides. Each third side (or its imaginary extending line) intersects with the third reference line L3, while each fourth side is parallel to the third reference line L3. That is, here, the long sides of the rectangles or parallelograms intersect with the third reference line L3, while their short sides are parallel to the third reference line L3.

With continued reference to FIG. 2, in this Embodiment, there are eight second pins 21 divided into four second-pin groups each containing two of them. Here, the four second-pin groups are indicated respectively at B1, B2, B3 and B4.

In this Embodiment, the imaginary extending line of each of the four second-pin groups intersects with the fourth reference line L4. In addition, the imaginary extending lines of all the (here, the two) second pins 21 in each second-pin group intersect with the fourth reference line L4 at a same point, and the imaginary extending lines of different second-pin groups intersect with the fourth reference line L4 at different points. That is, the imaginary extending lines of the two second pins 21 in the second-pin group B1 intersect with the fourth reference line L4 both at a point D20, the imaginary extending lines of the two second pins 21 in the second-pin group B2 intersect with the fourth reference line L4 both at a point D21, the imaginary extending lines of the two second pins 21 in the second-pin group B3 intersect with the fourth reference line L4 both at a point D22, and the imaginary extending lines of the two second pins 21 in the second-pin group B4 intersect with the fourth reference line L4 both at a point D23.

Further, all the second pins 21 in each of the second-pin groups are arranged symmetrically on both sides of the fourth reference line L4. That is, the two second pins 21 in the second-pin group B1 are arranged symmetrically with respect to the fourth reference line L4, the two second pins 21 in the second-pin group B2 are arranged symmetrically with respect to the fourth reference line L4, the two second pins 21 in the second-pin group B3 are arranged symmetrically with respect to the fourth reference line L4, and the two second pins 21 in the second-pin group B4 are arranged symmetrically with respect to the fourth reference line L4. In other embodiments, all the second pins 21 in a certain one of the second-pin groups may be arranged on both sides of the fourth reference line L4 in an asymmetric fashion.

Preferably, among all the second pins 21, the one being farthest from the fourth reference line L4 and having its imaginary extending line intersecting with the fourth reference line L4 has an angle of 5° to 15° formed between its imaginary extending line and the fourth reference line L4. Further, for one of the second-pin groups having its imaginary extending line intersecting with the fourth reference line L4, the distance from the intersection to a distal end of the one of the second pins 21 in the second-pin group farthest from the fourth reference line L4 satisfies:

$$R_2=360 \times W_2 \times M_2/(\pi \times \theta_2)$$

where, the distal end- refers to the end of the second pin 21 farther from the intersection, $R_2$ represents the distance from the intersection to the distal end of the second pin 21 farthest from the fourth reference line L4, $W_2$ denotes the cross-sectional width of the second pin 21 (which may either be a cross-sectional width taken along the third reference line L3 or an average cross-sectional width of the second pin taken in the direction of the third reference line L3), $M_2$ is the number of the second pins 21, $\pi$ is a constant, and $\theta_2$ is the angle between the imaginary extending line of the second pin 21 farthest from the fourth reference line L4 and the fourth reference line L4.

Flat Panel Display Device: In this Embodiment, there is also provided a corresponding flat panel display device. With combined reference to FIGS. 1 and 2, in this Embodiment, the flat panel display device comprises a driver circuit carrier 1 and a display panel 2. The driver circuit carrier 1 comprises the substrate 10 and a plurality of first pins 11 on at least one surface of the substrate 10. All the first pins 11 are arranged along a first reference line L1, and an imaginary extending line of at least one of the first pins 11 intersects with a second reference line L2 perpendicular to the first reference line L1.

The display panel 2 comprises a non-display area 20 in which a plurality of second pins 21 are arranged along the third reference line L3. An imaginary extending line of at least one of the second pins 21 intersects with a fourth reference line L4 perpendicular to the third reference line L3.

The first pins 11 in the driver circuit carrier 1 are fully or partially bonded to the second pins 21 in the display panel 2 so that the second reference line L2 coincides with the fourth reference line L4.

Embodiment 2

Identical elements or elements performing identical functions are denoted by the same reference numerals in this Embodiment and in Embodiment 1. The following description focuses on the differences of this Embodiment from Embodiment 1.

Figure 3:
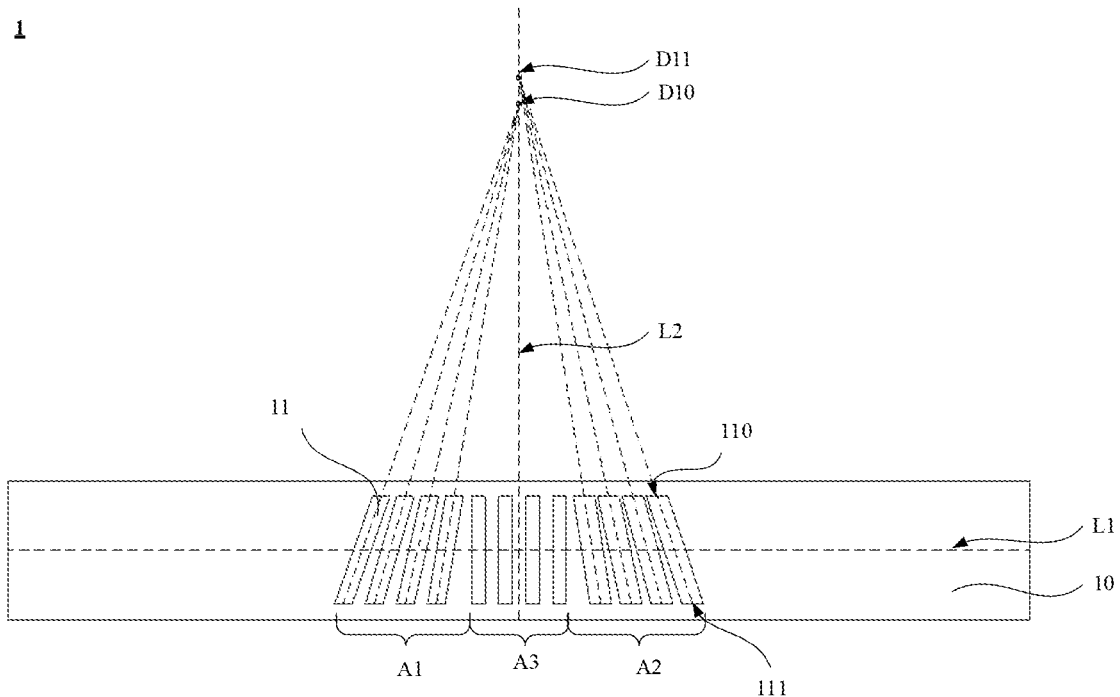

Driver Circuit Carrier: Reference is now made to FIG. 3, a structural schematic of a driver circuit carrier according to Embodiment 2 of the present invention. As shown in FIG. 3, in this Embodiment, there are twelve first pins 11 divided into three first-pin groups each containing four of them. Here, the three first-pin groups are indicated respectively at A1, A2 and A3.

In this Embodiment, imaginary extending lines of the first-pin group A1 and the first-pin group A2 intersect with a second reference line L2, while the first-pin group A3 extends parallel to the second reference line L2. In addition, the imaginary extending lines of the four first pins in the first-pin group A1 and the first-pin group A2 intersect the second reference line L2 at different points. Specifically, the imaginary extending lines of the four first pins 11 in the first-pin group A1 intersect with the second reference line L2 all at a point D10, and the imaginary extending lines of the four first pins 11 in the first-pin group A2 intersect with the second reference line L2 all at a point D11, and the four first pins 11 in the first-pin group A3 all extend parallel to the second reference line L2.

The first-pin group A3 is located between the first-pin group A1 and the first-pin group A2. Furthermore, the first pins 11 in the first-pin group A1 are all arranged on the same side of the second reference line L2, the first pins 11 in the first-pin group A2 are also all arranged on the same side of the second reference line L2, and the first pins 11 in the first-pin group A1 and the first pins 11 in the first-pin group A2 are respectively disposed at opposite sides of the second reference line L2. The four first pins 11 in the first-pin group A3 are arranged on both sides of the second reference line L2. That is, the second reference line L2 is situated in the first-pin group A3.

With continued reference to FIG. 3, in this Embodiment, the four first pins 11 in the first-pin group A1 have the same cross-sectional width along the first reference line L1, indicated at $W_{A1}$, the four first pins 11 in the first-pin group A2 also have the same cross-sectional width along the first reference line L1, indicated at $W_{A2}$, and the four first pins 11 in the first-pin group A3 have the same cross-sectional width along the first reference line L1, indicated at $W_{A3}$. $W_{A3}$ is smaller than $W_{A1}$, whilst $W_{A1}$ is smaller than $W_{A2}$.

With the middle position of the substrate 10 (roughly the position of the second reference line L2) as a reference, upon deformation of the substrate 10, the two sides tend to experience greater amounts of deformation than that of the middle portion. Here, differentiating the cross-sectional width (increasing from the middle to two sides) of the first pins 11 enables compliance with the material properties of the substrate 10 and optimizes compensation for expansion/tension-caused deformation at various positions of the substrate 10.

In the first-pin group A1 or A2, preferably, the distance from the point D10 or D11 to a distal end of the one of the first pins 11 in the first-pin group A1 or A2 farthest from the second reference line L2 satisfies:

$$R_1=360 \times W_1 \times M_1/(\pi \times \theta_1)$$

where, the distal end refers to the end of the first pin 11 farther from the point D10 or D11, $R_1$ represents the distance from the point D10 or D11 to the distal end of the first pin 11 farthest from the second reference line L2, $W_1$ denotes the cross-sectional width of the first pin 11 farthest from the second reference line L2, $M_1$ refers to the number of the first pins 11, $\pi$ is a constant, and $\theta_1$ refers to the angle between the imaginary extending line of the first pin 11 farthest from the second reference line L2 and the second reference line L2. Preferably, $\theta_1$ ranges from 5° to 15°.

Figure 4:
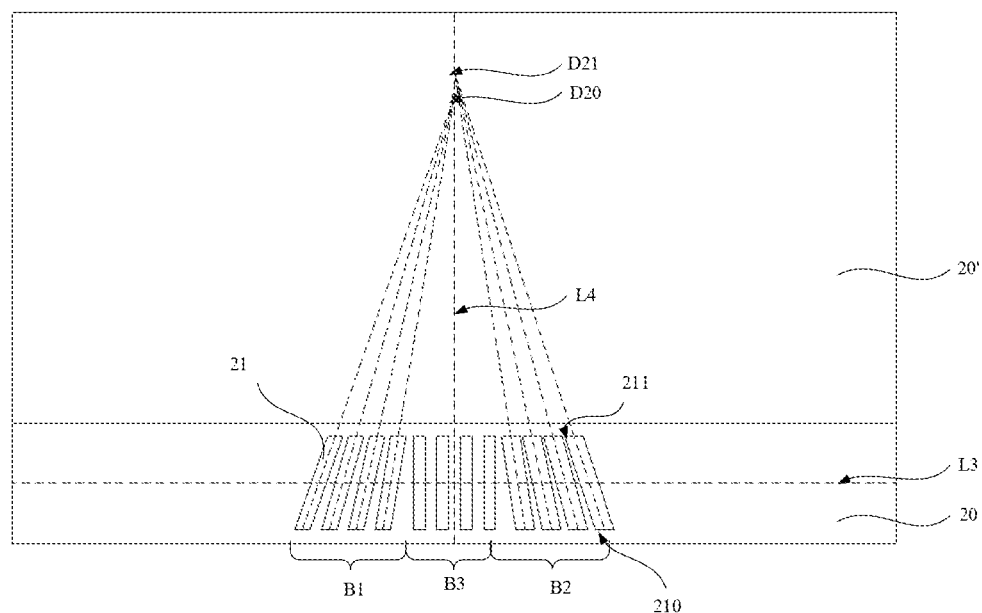

Display Panel: In this Embodiment, there is also provided a corresponding display panel. Specifically, reference is made to FIG. 4, a structural schematic of the display panel according to Embodiment 2. As shown in FIG. 4, the display panel 2 comprises a non-display area 20 in which a plurality of second pins 21 is arranged. The second pins 21 are provided in correspondence with the first pins 11. Reference can be made to the first pins 11 of this Embodiment and to Embodiment 1 for more details of the second pins 21, and a further detailed description of them is omitted.

Flat Panel Display Device: In this Embodiment, there is also provided a corresponding flat panel display device. With combined reference to FIGS. 3 and 4, in this Embodiment, the flat panel display device comprises a driver circuit carrier 1 and a display panel 2. The first pins 11 in the driver circuit carrier 1 are fully or partially bonded to the second pins 21 in the display panel 2 so that the second reference line L2 coincides with the fourth reference line L4.

Embodiment 3

Identical elements or elements performing identical functions are denoted by the same reference numerals in this and preceding Embodiments. The following description focuses on the differences of this Embodiment from preceding Embodiments.

Figure 5:
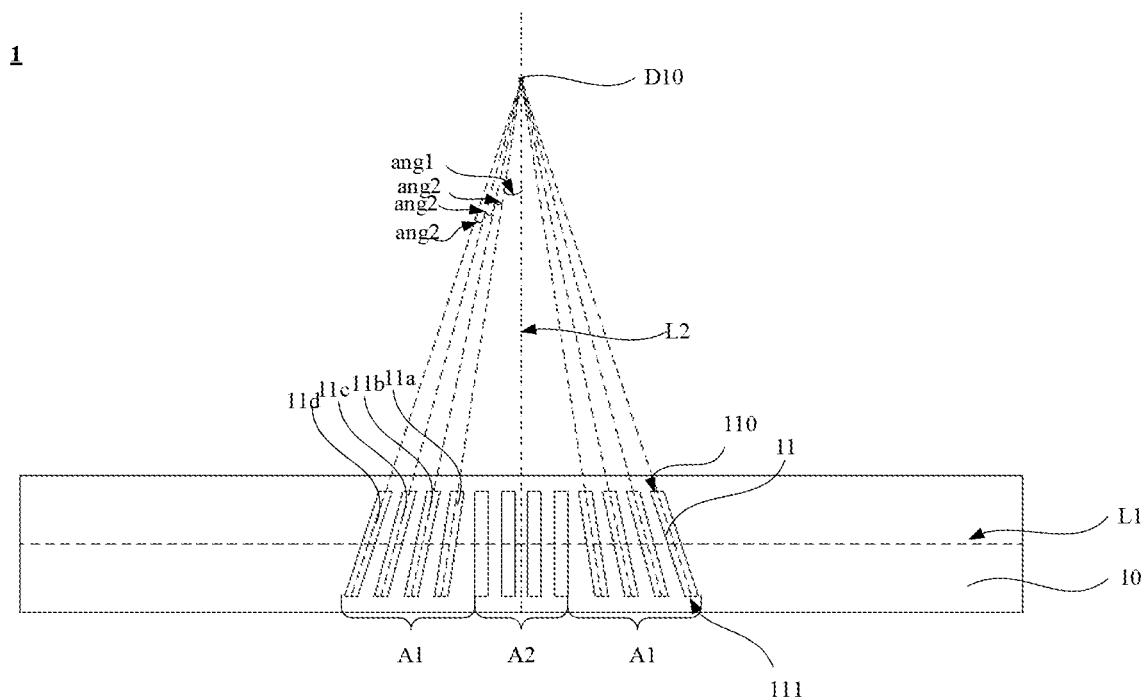

Driver Circuit Carrier: Reference is now made to FIG. 5, a structural schematic of a driver circuit carrier according to Embodiment 3 of the present invention. As shown in FIG. 5, in this Embodiment, there are twelve first pins 11 divided into two first-pin groups, i.e., a first-pin group A1 and a first-pin group A2. The first-pin group A1 contains eight of the first pins 11, while the first-pin group A2 contains four of them.

In this Embodiment, imaginary extending line of the first-pin group A1 intersects with a second reference line L2, while the first-pin group A2 extends parallel to the second reference line L2. Specifically, the imaginary extending lines of the eight first pins 11 in the first-pin group A1 intersect with the second reference line L2 all at a point D10, and the four first pins 11 in the first-pin group A2 all extend parallel to the second reference line L2. The first-pin group A2 is located in the first-pin group A1. Further, the first-pin group A1 and the first-pin group A2 are respectively arranged symmetrically with respect to the second reference line L2.

In the first-pin group A1, the angle between the imaginary extending line of one of the first pins 11 close to the second reference line L2 and the second reference line L2 is less than the angle between the imaginary extending line of another one of the first pins 11 farther from the second reference line L2 and the second reference line L2. Preferably, in a direction from one of the first pins closest to the second reference line L2 to another one of the first pins farthest from the second reference line L2, the angle between the imaginary extending line of each first pin and the second reference line L2 increases gradually. In a direction from one of the first pins closest to the second reference line L2 to another one of the first pins far away from the second reference line L2, each first pin has a same or different increment in the angles between its imaginary extending line and the second reference line L2 compared to a previous first pin. In a direction from one of the first pins closest to the second reference line L2 to another one of the first pins farthest from the second reference line L2, when each first pin has a different increment in the angles between its imaginary extending line and the second reference line L2 compared to a previous first pin, the increment can be increased or decreased.

Since the first-pin group A1 is symmetrical with respect to the second reference line L2, the angular relation of each first pin 11 on one side of the second reference line L2 is identical to that of the corresponding first pin on another side of the second reference line L2. Therefore, this Embodiment will be further described below with only the first pins 11 in the first-pin group A1 on one side of the second reference line L2 as an example.

In the first-pin group A1, there are four first pins 11 on one side of the second reference line L2, referred hereinafter to as the first pin 11a, the first pin 11b, the first pin 11c and the first pin 11d, in a direction from one of the first pins closest to the second reference line L2 to another one of the first pins farthest from the second reference line L2, for the sake of convenience of illustration. In a direction from one of the first pins closest to the second reference line L2 to another one of the first pins farthest from the second reference line L2, if each first pin has a same increment in the angle between its imaginary extending line and the second reference line L2 compared to a previous first pin, then the angle between the first pin 11a and the second reference line L2 is equal to ang1, the angle between the first pin 11b and the second reference line L2 is equal to (ang1+ang2), the angle between the first pin 11c and the second reference line L2 is equal to (ang1+2*ang2), and the angle between the first pin 11d and the second reference line L2 is equal to (ang1+3*ang2).

In this Embodiment, the second reference line L2 is situated in or close to the intermediate position of the substrate 10. Accordingly, a plurality of the first pins 11 located at the edge (or two sides) of the substrate 10 are more obliquely than those located at intermediate position with respect to the first reference line L1. In general terms, the edge position of the substrate 10 are prone to experience tensile deformation (i.e., an expansion), while the intermediate portion thereof are not, or are subject to a smaller degree of tensile deformation. The increase in the angle between the imaginary extending line of each first pin and the second reference line L2, in a direction from one of the first pins 11 closest to the second reference line L2 to another one of the first pins 11 farthest from the second reference line L2, enables maximized compliance with the properties of the substrate 10 and significant compensation for its tensile deformation.

In this Embodiment, among a plurality of the first pins 11, adjacent first pins are spaced apart equidistantly. That is, adjacent first pins 11 in the first-pin group A1, in the first-pin group A2 and respectively in these two groups are spaced apart equidistantly. However, in other embodiments, among a plurality of the first pins 11, spacing between adjacent first pins 11 close to the second reference line L2 may be smaller than spacing between adjacent first pins 11 farther from the second reference line L2. Alternatively, among a plurality of the first pins 11, spacing between adjacent first pins 11 close to the second reference line L2 may be greater than spacing between adjacent first pins 11 farther from the second reference line L2. Still alternatively, among all of the first pins, spacing between adjacent first pins 11 close to the second reference line L2 is smaller than spacing between adjacent first pins 11 away from the second reference line L2. Alternatively, in the first-pin group A1, spacing between adjacent first pins 11 close to the second reference line L2 is smaller than spacing between adjacent first pins 11 farther from the second reference line L2, while all (four) of the first pins 11 in the second-pin groups A2 are equidistantly arranged. Spacing between adjacent first pins 11 mentioned above refers to a distance between midpoints of two adjacent first pins along the first reference line L1 (i.e., the midpoints of two segments formed by coinciding adjacent first pins with the first reference line L1).

With continued reference to FIG. 5, in this Embodiment, each first pin 11 has a same cross-sectional width. That is, all the eight first pins 11 in the first-pin group A1 have the same cross-sectional width, indicated at $W_{A1}$, and all the four first pins 11 in the first-pin group A2 have the same cross-sectional width, indicated at $W_{A2}$, where $W_{A1}=W_{A2}$. In other embodiment, cross-sectional width of one of the first pins 11 close to the second reference line L2 may be smaller than that of another one of the first pins 11 farther from the second reference line L2. Alternatively, cross-sectional width of one of the first pins 11 close to the second reference line L2 may be greater than that of another one of the first pins 11 farther from the second reference line L2. Still alternatively, among all of the first pins, cross-sectional width of one of the first pins 11 close to the second reference line L2 is smaller than another one of the first pins 11 farther from the second reference line L2. Alternatively, in the first-pin group A1, cross-sectional width of one of the first pins close to the second reference line L2 is smaller than another one of the first pins 11 farther from the second reference line L2, while all the (four) first pins 11 in the second-pin group A2 have an equal cross-section width. Preferably, each first pin has an increasing cross-sectional width in a direction from one of the first pins closest to the second reference line L2 to another one of the first pins farthest from the second reference line L2. The cross-sectional widths of the first pins 11 mentioned may be taken along the first reference line L1, i.e., the lengths of portions of the first reference line L1 that overlap the first pins 11.

In the first-pin group A1, preferably, the distance from the point D10 to a distal end of one of the first pins 11 farthest from the second reference line L2 satisfies:

$$R_1=360\times W_1\times M_1/(\pi\times\theta_1)$$

where, the distal end refers to the end of the first pins 11 farther from the point D10, $R_1$ represents the distance from the point D10 to the distal end of the first pin 11 farthest from the second reference line L2, $W_1$ denotes the cross-sectional width of the first pin 11 farthest from the second reference line L2, $M_1$ refers to the number of the first pins 11, $\pi$ is a constant, and $\theta_1$ refers to the angle between the imaginary extending line of the first pins 11 farthest from the second reference line L2 and the second reference line L2. Preferably, $\theta_1$ ranges from 5° to 15°.

Figure 6:
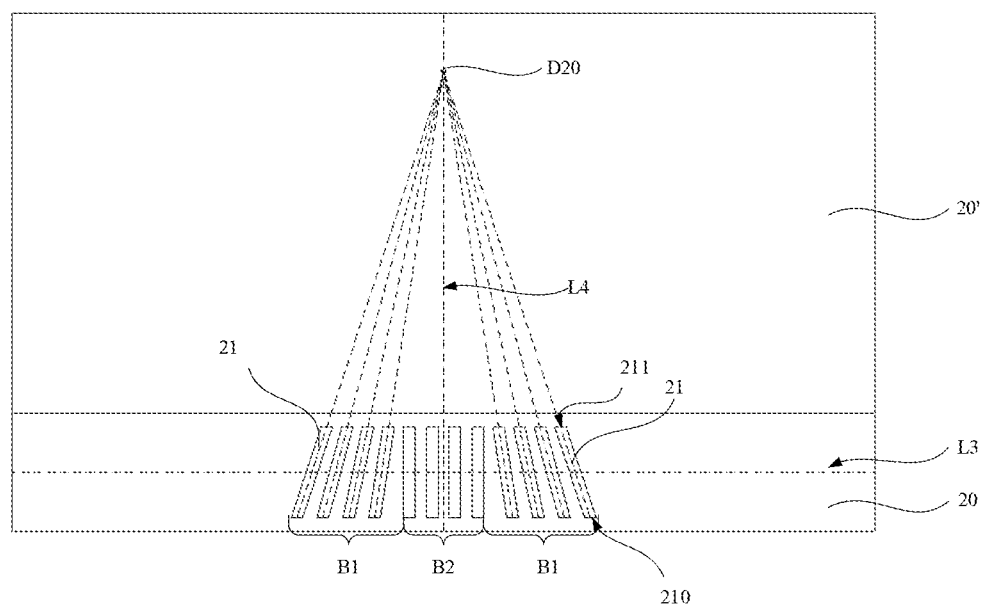

Display Panel: In this Embodiment, there is also provided a corresponding display panel. Specifically, reference is made to FIG. 6, a structural schematic of the display panel according to Embodiment 3. As shown in FIG. 6, the display panel 2 comprises a non-display area 20 in which a plurality of second pins 21 is arranged. The second pins 21 are provided in correspondence with the first pins 11. Reference can be made to the first pins 11 of this Embodiment and to Embodiment 1 for more details of the second pins 21, and a further detailed description of them is omitted.

Flat Panel Display Device: In this Embodiment, there is also provided a corresponding flat panel display device. In conjunction with FIGS. 5 and 6, in this Embodiment, the flat panel display device comprises a driver circuit carrier 1 and a display panel 2. The first pins 11 in the driver circuit carrier 1 are fully or partially bonded to the second pins 21 in the display panel 2 so that the second reference line L2 coincides with the fourth reference line L4.

Embodiment 4

Identical elements or elements performing identical functions are denoted by the same reference numerals in this and preceding Embodiments. The following description focuses on the differences of this Embodiment from preceding Embodiments.

Figure 7:
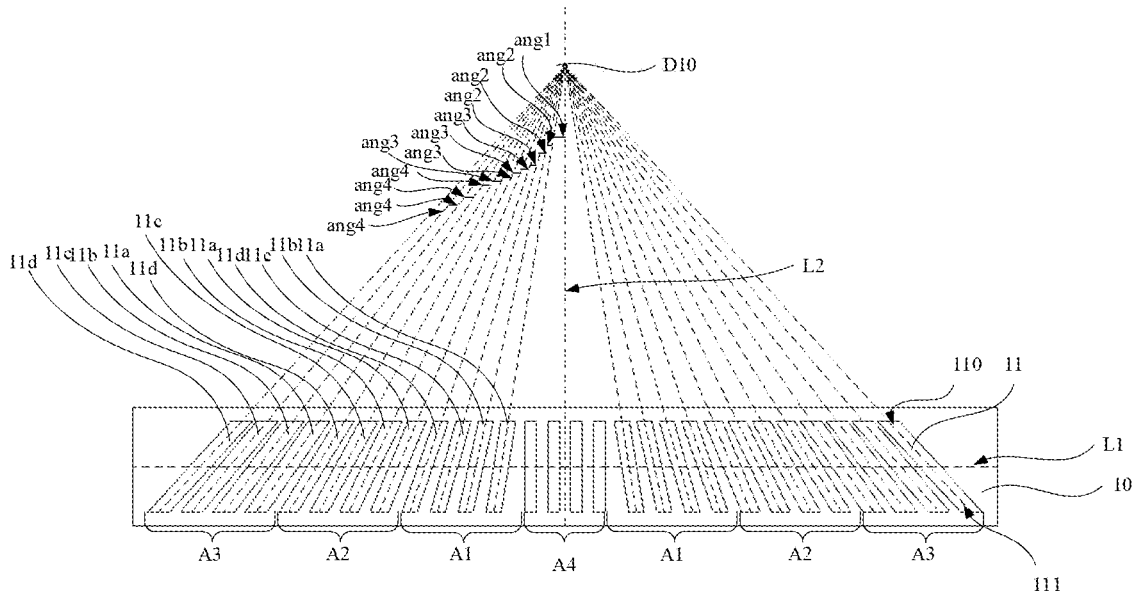

Driver Circuit Carrier: Referring to FIG. 7, a structural schematic of a driver circuit carrier according to Embodiment 4 of the present invention. As shown in FIG. 7, in this Embodiment, there are twenty-eight first pins 11 divided into four first-pin groups A1-A4. Each of the first-pin groups A1-A3 contains eight of the first pins 11, while the first-pin group A4 contains four of the first pins 11.

In this Embodiment, imaginary extending line of each of the first-pin groups A1-A3 intersects with a second reference line L2 at a same point D10, while the first-pin group A4 extends parallel to the second reference line L2. In addition, the first-pin group A2 is located in internal side of the first-pin group A3 (i.e., the first-pin group A2 is closer to an intermediate position of the substrate 10 than the first-pin group A3), the first-pin group A1 is located in internal side of the first-pin group A2 and the first-pin group A4 is located in internal side of the first-pin group A1. Furthermore, each of the first-pin group A1, the first-pin group A2, the first-pin group A3 and the first-pin group A4 is symmetrical with respect to the second reference line L2.

In each of the first-pin group A1, the first-pin group A2 and the first-pin group A3, the angle between the imaginary extending line of one of the first pins 11 close to the second reference line L2 and the second reference line L2 is smaller than the angle between the imaginary extending line of another one of the first pins 11 away from the second reference line L2 and the second reference line L2. Preferably, along a direction from one of the first pins closest to the second reference line L2 to another one of the first pins farthest from the second reference line L2, the angle between the imaginary extending line of each first pin and the second reference line L2 increases gradually. Additionally, among all the first-pin groups and along a direction from one of the first-pin groups closest to the second reference line L2 to another one of the first-pin groups farthest from the second reference line L2, each first-pin group preferably has a greater increment in the angles between the imaginary extending lines of the corresponding first pins and the second reference line L2.

Furthermore, among all of the first pins 11, cross-sectional widths of at least two of the first pins 11 taken along the first reference line L1 are different. Differentiating the cross-sectional width of the first pins 11 allows better compliance to the properties of the substrate 10. In this Embodiment, in each of the first-pin groups, each first pin has a same cross-sectional width taken along the first reference line L1, and among all the first-pin groups and in a direction from one of the first-pin groups closest to the second reference line L2 to another one of the first-pin groups farthest from the second reference line L2, the first-pins in the first-pin group has a greater cross-sectional width taken along the first reference line L1. In each of the first-pin groups, adjacent first pins are spaced apart equidistantly along the first reference line L1. Among all the first-pin groups, along a direction from one of the first-pin groups closest to the second reference line L2 to another one of the first-pin groups farthest from the second reference line L2, the space between adjacent first pins at the first reference line L1 become greater.

Since each of the first-pin group A1, the first-pin group A2 and the first-pin group A3 is symmetrical with respect to the second reference line L2, the angular relation of each first pin 11 on one side of the second reference line L2 is identical to that of the corresponding first pin on another side of the second reference line L2. Therefore, this Embodiment will be further described below with only the first pins 11 on one side of the second reference line L2 as an example for the first-pin group A1, the first-pin group A2 and the first-pin group A3.

For example, in the first-pin group A1, there are four first pins 11 on one side of the second reference line L2, referred hereinafter to as the first pin 11*a*-A1, the first pin 11*b*-A1, the first pin 11*c*-A1 and the first pin lid-A1, from one of the first pins closest to the second reference line L2 to another one of the first pins farthest from the second reference line L2, for the sake of convenience of illustration. Preferably, the angle between the imaginary extending line of the first pin 11*a*-A1 and the second reference line L2 is equal to ang1, the angle between the imaginary extending line of the first pin 11*b*-A1 and the second reference line L2 is equal to (ang1+ ang2), the angle between the imaginary extending line of the first pin 11*c*-A1 and the second reference line L2 is equal to (ang1+2*ang2), and the angle between the imaginary extending line of the first pin 11*d*-A1 and the second reference line L2 is equal to (ang1+3*ang2). Additionally, the distance between the first pin 11*a*-A1 and the first pin 11*b*-A1 is equal to d1, the distance between the first pin 11*b*-A1 and the first pin 11*c*-A1 is equal to d1, and the distance between the first pin 11*c*-A1 and the first pin 11*d*-A1 is equal to d1. The cross-sectional widths of the first pin 11*a*-A1, the first pin 11*b*-A1, first pin 11*e*-A1 and the first pin 11*d*-A1 are respectively equal to d2.

In the first-pin group A2, there are four first pins 11 on one side of the second reference line L2, referred hereinafter to as the first pin 11*a*-A2, the first pin 11*b*-A2, the first pin 11*c*-A2 and the first pin 11*d*-A2, in a direction from one of the first pins closest to the second reference line L2 to another one of the first pins farthest from the second reference line L2, for the sake of convenience of illustration. Preferably, the angle between the imaginary extending line of the first pin 11*a*-A2 and the second reference line L2 is equal to (ang1+3*ang2+ang3), the angle between the imaginary extending line of the first pin 11*b*-A2 and the second reference line L2 is equal to (ang1+3*ang2+2*ang3), the angle between the imaginary extending line of the first pin 11*c*-A2 and the second reference line L2 is equal to (ang1+ 3*ang2+3*ang3), and the angle between the imaginary extending line of the first pin 11*d*-A2 and the second reference line L2 is equal to (ang1+3*ang2+4*ang3). Preferably, ang3 is greater than ang2. The distance between the first pin 11*a*-A2 and the first pin 11*b*-A2 is equal to d3, the distance between the first pin 11*b*-A2 and the first pin 11*c*-A2 is equal to d3, and the distance between the first pin 11*c*-A2 and the first pin 11*d*-A2 is equal to d3. Wherein, d3 may be either greater than or equal to d1. The cross-sectional widths of the first pin 11*a*-A2, the first pin 11*b*-A2, first pin 11*c*-A2 and the first pin 11*d*-A2 are respectively equal to d4. Preferably, d4 is greater than d2.

In the first-pin group A3, there are four first pins 11 on one side of the second reference line L2, referred hereinafter to as the first pin 11*a*-A3, the first pin 11*b*-A3, the first pin 11*c*-A3 and the first pin 11*d*-A3, in a direction from one of the first pins closest to the second reference line L2 to another one of the first pins farthest from the second reference line L2, for the sake of convenience of illustration. Preferably, the angle between the imaginary extending line of the first pin 11*a*-A3 and the second reference line L2 is equal to (ang1+3*ang2+4*ang3+ang4), the angle between the imaginary extending line of the first pin 11*b*-A3 and the second reference line L2 is equal to (ang1+3*ang2+4*ang3+ 2*ang4), the angle between the imaginary extending line of the first pin 11*c*-A3 and the second reference line L2 is equal to (ang1+3*ang2+4*ang3+3*ang4), and the angle between the imaginary extending line of the first pin 11*d*-A3 and the second reference line L2 is equal to (ang1+3*ang2+4*ang3+ 4*ang4). Preferably, ang4 is greater than ang3. The distance between the first pin 11*a*-A3 and the first pin 11*b*-A3 is equal to d5, the distance between the first pin 11*b*-A3 and the first pin 11*c*-A3 is equal to d5, and the distance between the first pin 11*c*-A3 and the first pin 11*d*-A3 is equal to d5. Wherein, d5 may be either greater than or equal to d3. The cross-sectional widths of the first pin 11*a*-A3, the first pin 11*b*-A3, first pin 11*c*-A3 and the first pin 11*d*-A3 are respectively equal to d6. Preferably, d6 is greater than d4.

In each of the first-pin groups, preferably, the distance from the point D10 to a distal end of one of the first pins 11 farthest from the second reference line L2 satisfies:

$$R_1 = 360 \times W_1 \times M_1 / (\pi \times \theta_1)$$

where, the distal end refers to the end of the first pin 11 farther from the point D10, $R_1$ represents the distance from the point D10 to the distal end of the first pin 11 farthest from the second reference line L2, $W_1$ denotes the cross-sectional width of the first pin 11 farthest from the second reference line L2, $M_1$ refers to the number of the first pins 11, $\pi$ is a constant, and $\theta_1$ refers to the angle between the imaginary extending line of the first pin 11 farthest from the second reference line L2 and the second reference line L2. Preferably, $\theta_1$ ranges from 5° to 15°.

Figure 8:
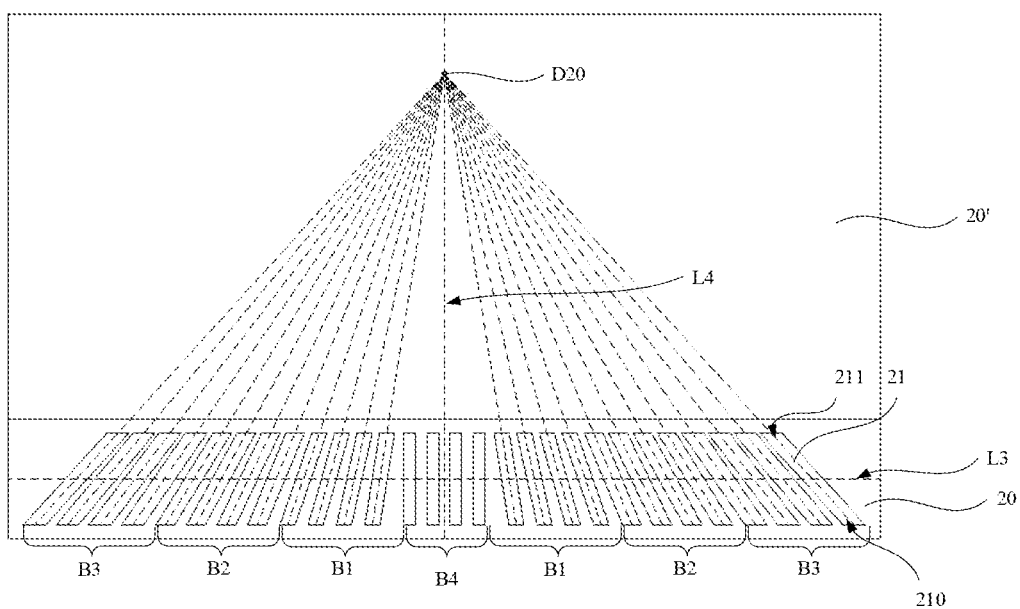

Display Panel: In this Embodiment, there is also provided a corresponding display panel. Specifically, reference is made to FIG. 8, a structural schematic of the display panel according to Embodiment 4. As shown in FIG. 8, the display panel 2 comprises a non-display area 20 in which a plurality of second pins 21 are formed. The second pins 21 are provided in correspondence with the first pins 11. Reference can be made to the first pins 11 of this Embodiment and to Embodiment 1 for more details of the second pins 21, and a further detailed description of them is omitted.

Flat Panel Display Device: In this Embodiment, there is also provided a corresponding flat panel display device. In conjunction with FIGS. 7 and 8, in this Embodiment, the flat panel display device comprises a driver circuit carrier 1 and a display panel 2. The first pins 11 in the driver circuit carrier 1 are fully or partially bonded to the second pins 21 in the display panel 2 so that the second reference line L2 coincides with the fourth reference line L4.

Embodiment 5

Identical elements or elements performing identical functions are denoted by the same reference numerals in this and preceding Embodiments. The following description focuses on the differences of this Embodiment from preceding Embodiments.

Figure 9:
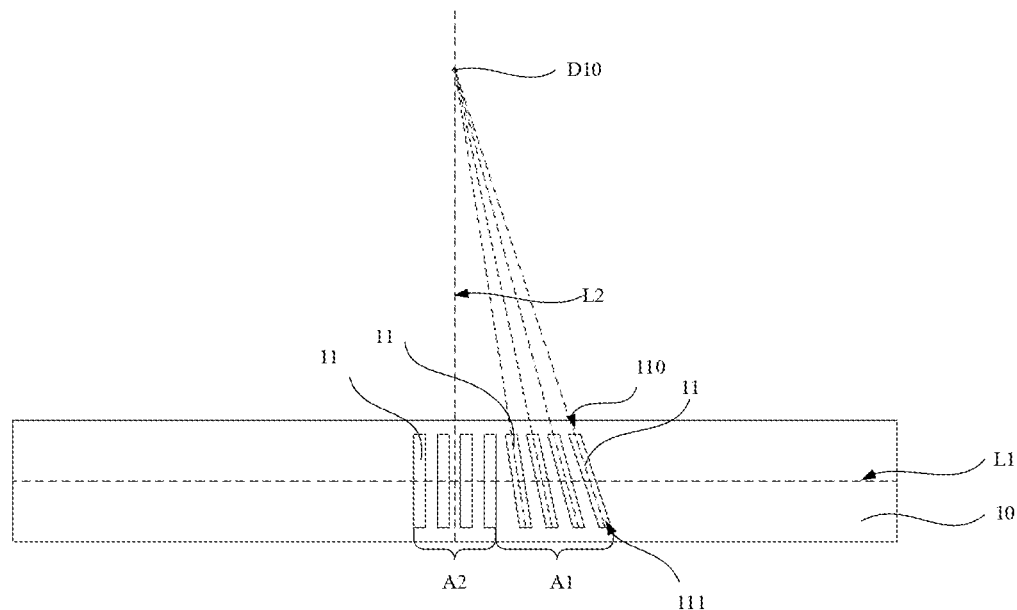

Driver Circuit Carrier: Referring to FIG. 9, a structural schematic of a driver circuit carrier according to Embodiment 5 of the present invention. As shown in FIG. 9, an overall shape of the layout for all of the first pins 11 according to this Embodiment appears like a right-angled trapezoid. Additionally, each of the first pins 11 is bisected, along the direction of a second reference line L2, by a first reference line L1 into two halves.

The number of the first pins 11 is eight, and they are divided into two first-pin groups A1 and A2 respectively comprising four first-pins. In this Embodiment, the imaginary extending line of the first-pin group A1 intersects with the second reference line L2 at a point D10, while the first-pin group A2 extends parallel to the second reference line L2. The first-pin group A2 is located at one side of the first-pin group A1.

The second reference line L2 could be situated in the first-pin group A1, or in the first-pin group A2, or between the first-pin group A1 and the first-pin group A2, or at one side of all of the first pins 11. In this Embodiment, the second reference line L2 situated in the first-pin group A2.

With continued reference to FIG. 9, in the first-pin group A1, the angle between the imaginary extending line of one of the first pins 11 close to the second reference line L2 and the second reference line L2 is smaller than the angle between the imaginary extending line of another one of the first pins 11 away from the second reference line L2 and the second reference line L2. Preferably, in a direction from one of the first pins closest to the second reference line L2 to another one of the first pins farthest from the second reference line L2, the angle between the imaginary extending line of each first pin and the second reference line L2 increases gradually.

In the first-pin group A1, preferably, the distance from the point D10 to a distal end of one of the first pins 11 farthest from the second reference line L2 satisfies:

$$R_1 = 360 \times W_1 \times M_1 / (\pi \times \theta_1)$$

The distal end refers to the end of the first pin 11 farther from the point D10, $R_1$ represents the distance from the point D10 to the distal end of the first pin 11 farthest from the second reference line L2, $W_1$ denotes the cross-sectional width of the first pin 11 farthest from the second reference line L2, $M_1$ refers to the number of the first pins 11, $\pi$ is a constant, and $\theta_1$ refers to the angle between the imaginary extending line of the first pins 11 farthest from the second reference line L2 and the second reference line L2. Preferably, $\theta_1$ ranges from 5° to 15°.

Figure 10:
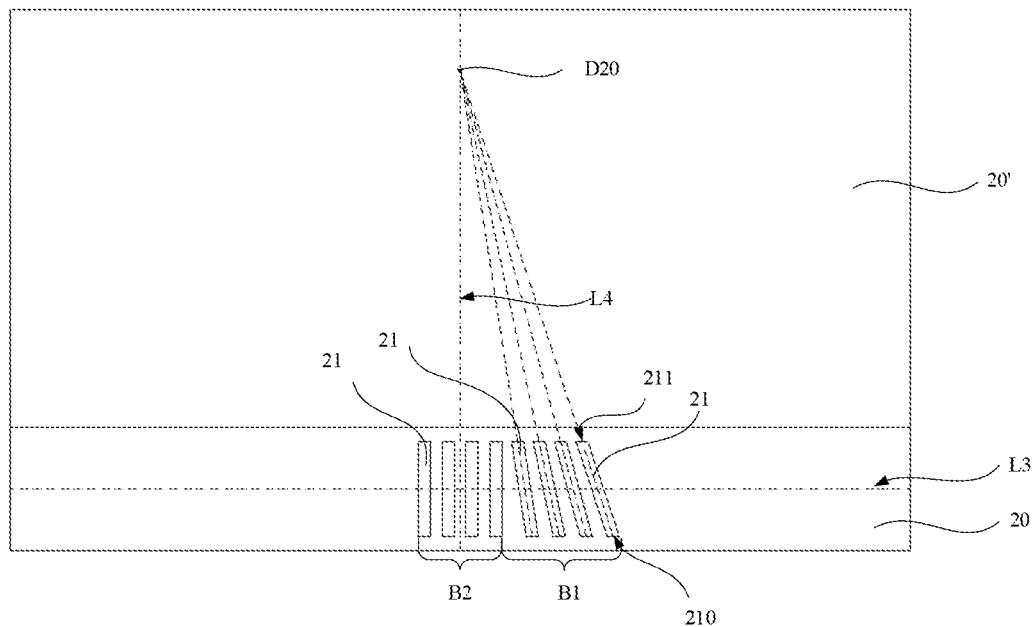

Display Panel: In this Embodiment, there is also provided a corresponding display panel. Specifically, referring to FIG. 10, a structural schematic of the display panel according to Embodiment 5. As shown in FIG. 10, the display panel 2 comprises a non-display area 20 in which a plurality of second pins 21 are arranged. The second pins 21 are provided in correspondence with the first pins 11. Reference can be made to the first pins 11 of this Embodiment and to Embodiment 1 for more details of the second pins 21, and a further detailed description of them is omitted.

Flat Panel Display Device: a corresponding flat panel display device is provided in the Embodiment. In conjunction with FIGS. 9 and 10, in this Embodiment, the flat panel display device comprises a driver circuit carrier 1 and a display panel 2. The first pins 11 in the driver circuit carrier 1 are fully or partially bonded to the second pins 21 in the display panel 2 so that the second reference line L2 coincides with the fourth reference line L4.

Embodiment 6

Identical elements or elements performing identical functions are denoted by the same reference numerals in this and preceding Embodiments. The following description focuses on the differences of this Embodiment from preceding Embodiments.

Figure 11:
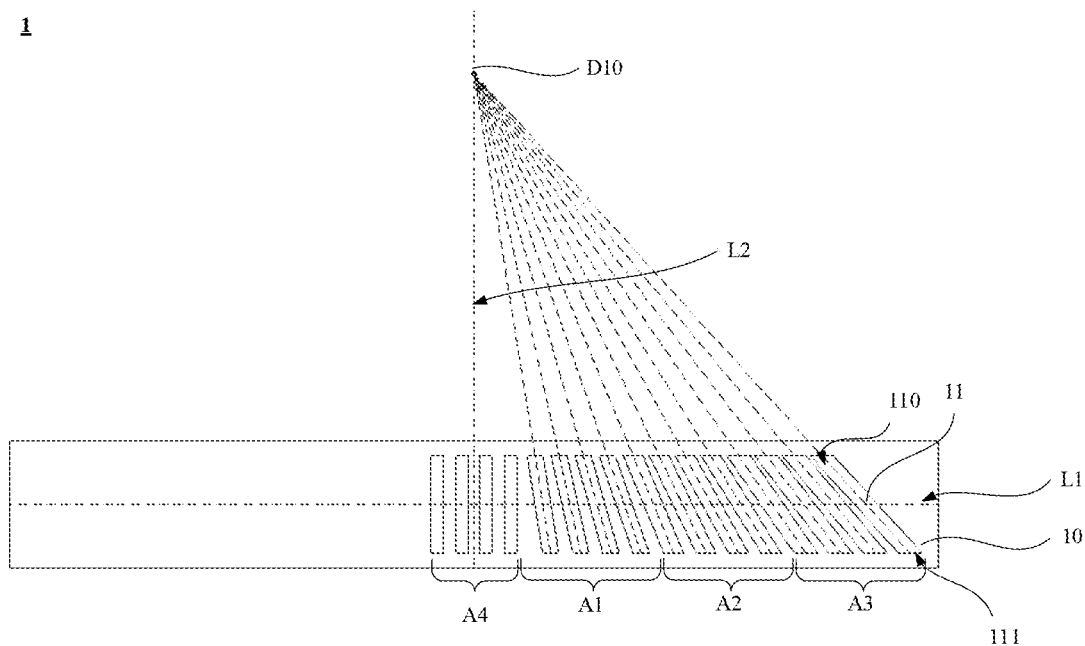

Driver Circuit Carrier: Referring to FIG. 11, a structural schematic of a driver circuit carrier according to Embodiment 6 of the present invention. As shown in FIG. 11, an overall shape of the layout for all of the first pins 11 according to this Embodiment appears like a right-angled trapezoid. The number of the first pins 11 is sixteen, and they are divided into four first-pin groups A1-A4 each comprising four first pins 11. In this Embodiment, imaginary extending line of each of the first-pin groups A1-A3 intersects with a second reference line L2, while the first-pin group A4 extends parallel to the second reference line L2. The first-pin group A4, the first-pin group A1, the first-pin group A2 and the first-pin group A3 are arranged along the first reference line L1 sequentially in this order.

In this Embodiment, the second reference line L2 is situated in the first-pin group A4. That is, among the three first-pin groups having their imaginary extending lines intersecting with the second reference line L2, the first-pin group A1 is closest to the second reference line L2, the first-pin group A2 is closer to the second reference line L2, and the first-pin group A3 is farthest from the second reference line L2.

With continued reference to FIG. 11, in each of the first-pin group A1 the first-pin group A2 and the first-pin group A3, the angle between the imaginary extending line of one of the first pins 11 close to the second reference line L2 and the second reference line L2 is smaller than the angle between the imaginary extending line of another one of the first pins 11 away from the second reference line L2 and the second reference line L2. Preferably, in a direction from one of the first pins closest to the second reference line L2 to another one of the first pins farthest from the second reference line L2, the angle between the imaginary extending line of each first pin and the second reference line L2 increases gradually.

Further, among all the first-pin groups and in a direction from one of the first-pin groups closest to the second reference line L2 to another one of the first-pin groups farthest from the second reference line L2 (i.e., from the first-pin group A1 to the first-pin group A3), each first-pin group preferably has a greater increment in the angles between the imaginary extending lines of the corresponding first pins and the second reference line L2 compared to a previous first-pin group.

Furthermore, in each of the first-pin groups, each first pin has a same cross-sectional width taken along the first reference line L1. Among all the first-pin groups and in a direction from one of the first-pin groups closest to the second reference line to another one of the first-pin groups farthest from the second reference line, each first-pin group has a greater cross-sectional width taken along the first reference line compared to a previous first-pin group.

In each of the first-pin groups, adjacent first pins are spaced apart equidistantly along the first reference line L1. Among all the first-pin groups along a direction from one of the first-pin groups closest to the second reference line to another one of the first-pin groups farthest from the second reference line, the space between adjacent first pins along the first reference line becomes greater. Additionally, spacing between adjacent first pins 11 in the first-pin group A4 along the first reference line L1 may be smaller than spacing between adjacent first pins 11 in the first-pin group A1 along the first reference line L1.

By arranging the first pins 11 along the first reference line L1 into an overall shape of right-angled trapezoid, the first-pin group A4 can be taken as a reference to facilitate the bonding of the driver circuit carrier 1 to the display panel. Moreover, in a direction from one of the first-pin groups closest to the second reference line to another one of the first-pin groups farthest from the second reference line, each first-pin group having a greater increment in the angles between the imaginary extending lines of the corresponding first pins and the second reference line, or having a same or greater spacing between adjacent first pins, or having a greater cross-sectional width, enables good compliance with the properties of the substrate 10 and compensation for its tensile deformation.

Figure 12:
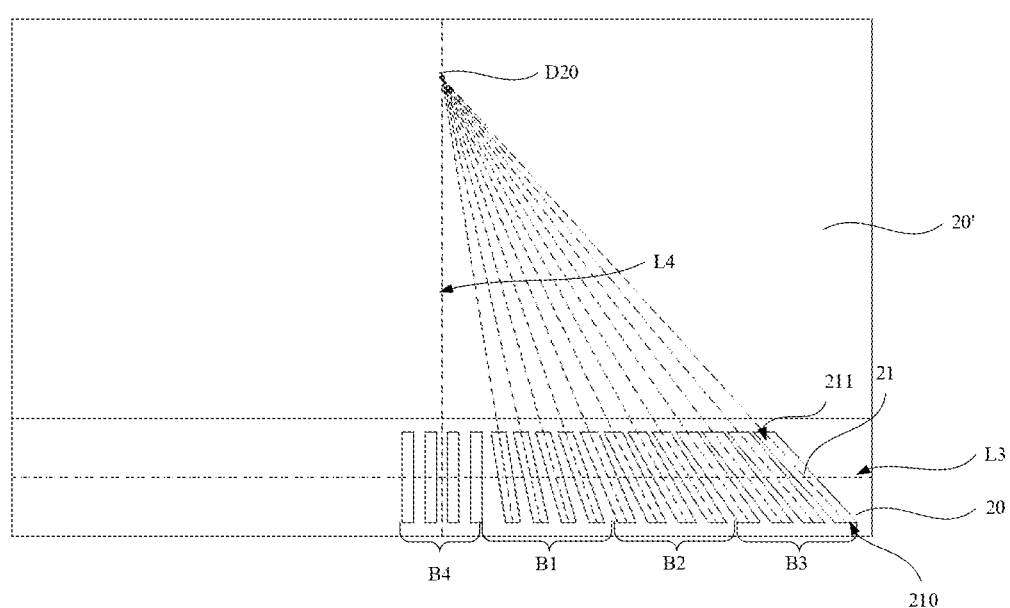

Display Panel: In this Embodiment, there is also provided a corresponding display panel. Specifically, referring to FIG. 12, a structural schematic of the display panel according to Embodiment 6. As shown in FIG. 12, the display panel 2 comprises a non-display area 20 in which a plurality of second pins 21 are arranged. The second pins 21 are provided in correspondence with the first pins 11. Reference can be made to the first pins 11 of this Embodiment and to Embodiment 1 for more details of the second pins 21, and a further detailed description of them is omitted.

Flat Panel Display Device: In this Embodiment, there is also provided a corresponding flat panel display device. In conjunction with FIGS. 11 and 12, in this Embodiment, the flat panel display device comprises a driver circuit carrier 1 and a display panel 2. The first pins 11 in the driver circuit carrier 1 are fully or partially bonded to the second pins 21 in the display panel 2 so that the second reference line L2 coincides with the fourth reference line L4.

Embodiment 7

Identical elements or elements performing identical functions are denoted by the same reference numerals in this and preceding Embodiments. The following description focuses on the differences of this Embodiment from preceding Embodiments.

Figure 13:
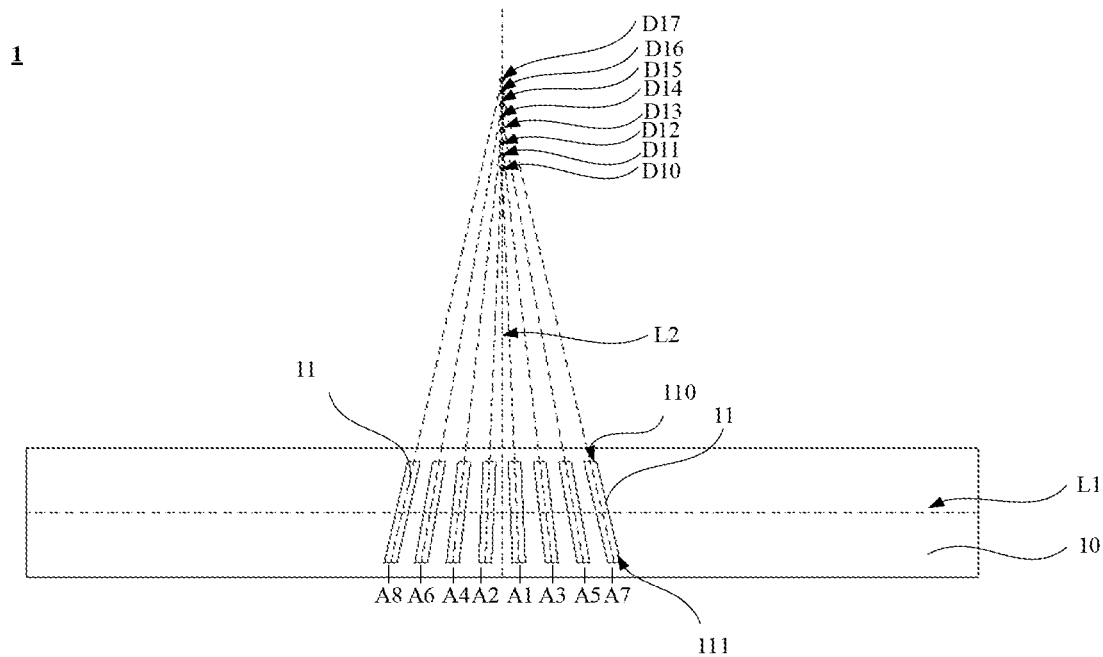

Driver Circuit Carrier: Reference is now made to FIG. 13, a structural schematic of a driver circuit carrier according to Embodiment 7 of the present invention. As shown in FIG. 13, in this Embodiment, there are eight first pins 11 divided into eight first-pin groups, i.e., a first-pin group A8, a first-pin group A6, a first-pin group A4, a first-pin group A2, a first-pin group A1, a first-pin group A3, a first-pin group A5 and a first-pin group A7, arranged along the first reference line L1 sequentially in this order.

In this Embodiment, imaginary extending lines of the eight first-pin groups all intersect with a second reference line L2. Additionally, the imaginary extending line of each first-pin group intersects with the second reference line L2 at different points. Specifically, the imaginary extending lines of the first-pin groups A1-A8 intersect with the second reference line L2 at the points D10-D17.

In this Embodiment, one of the first pins 11 close to the second reference line L2 may have its imaginary extending line intersecting with the second reference line L2 at a point close to the plurality of the first pins 11 (here, the plurality of the first pins 11 may be regarded as a whole). In other embodiments, it may be the case that one of the first pins 11 away from the second reference line L2 has its imaginary extending line intersecting with the second reference line L2 at a point close to the plurality of the first pins 11, or the case that at least some of the imaginary extending lines of the plurality of the first pins 11 cross one another.

Further, the angle between the imaginary extending line of one of the first pins 11 close to the second reference line L2 and the second reference line L2 may be smaller than, greater than or equal to the angle between the imaginary extending line of another one of the first pins 11 away from the second reference line L2 and the second reference line L2. Preferably, in a direction from one of the first pins closest to the second reference line to another one of the first pins farthest from the second reference line, each first pin has a greater angle between its imaginary extending line and the second reference line compared to a previous first pin. Moreover, in a direction from one of the first pins closest to the second reference line to another one of the first pins farthest from the second reference line, each first pin may have a same or different increment in the angles between its imaginary extending line and the second reference line compared to a previous first pin.

In this Embodiment, the eight first pins 11 are evenly arranged on both sides of the second reference line L2. On one side, the angle between the imaginary extending line of one of the first pins 11 close to the second reference line L2 and the second reference line L2 may be smaller than the angle between the imaginary extending line of another one of the first pins 11 away from the second reference line L2 and the second reference line L2, while on the other side, the angle between the imaginary extending line of one of the first pins 11 close to the second reference line L2 and the second reference line L2 may be equal to the angle between the imaginary extending line of another one of the first pins 11 away from the second reference line L2 and the second reference line L2. Alternatively, on both sides; the angle between the imaginary extending line of one of the first pins 11 close to the second reference line L2 and the second reference line L2 is smaller than the angle between the imaginary extending line of another one of the first pins 11 away from the second reference line L2 and the second reference line L2. The present application is not limited to this regard, and more choices are possible depending on the properties of the substrate 10.

Figure 14:
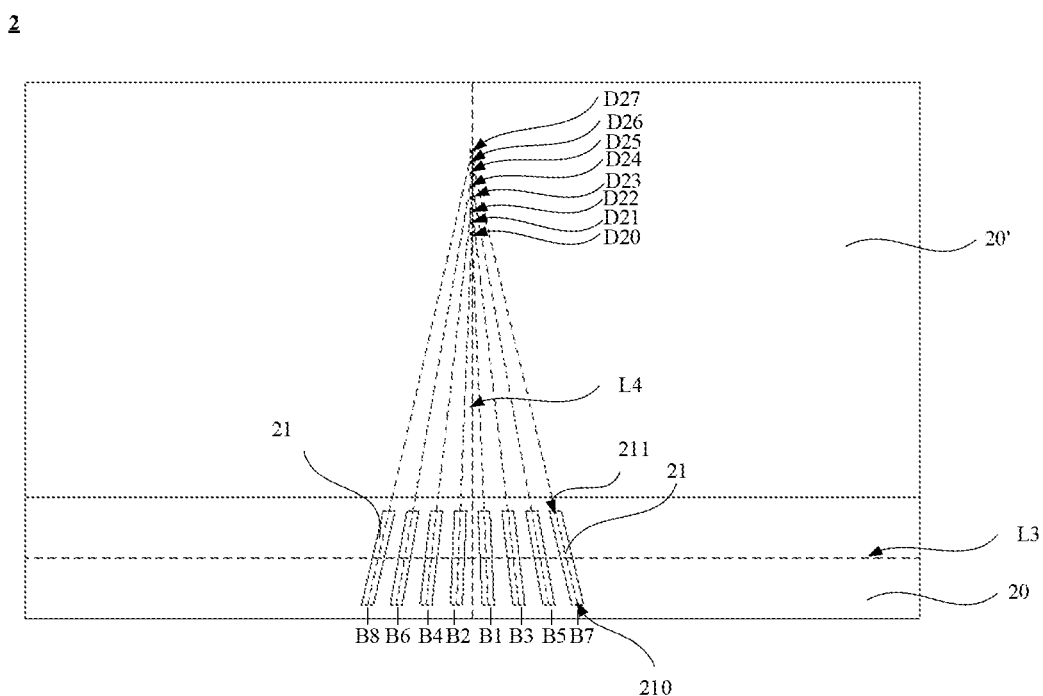

Display Panel: In this Embodiment, there is also provided a corresponding display panel. Specifically, reference is made to FIG. 14, a structural schematic of the display panel according to Embodiment 7. As shown in FIG. 14, the display panel 2 comprises a non-display area 20 in which a plurality of second pins 21 are arranged. The second pins 21 are provided in correspondence with the first pins 11. Reference can be made to the first pins 11 of this Embodiment and to Embodiment 1 for more details of the second pins 21, and a further detailed description of them is omitted.

Flat Panel Display Device: In this Embodiment, there is also provided a corresponding flat panel display device. In conjunction with FIGS. 13 and 14, in this Embodiment, the flat panel display device comprises a driver circuit carrier 1 and a display panel 2. The first pins 11 in the driver circuit carrier 1 are fully or partially bonded to the second pins 21 in the display panel 2 so that the second reference line L2 coincides with the fourth reference line L4.

Embodiment 8

Identical elements or elements performing identical functions are denoted by the same reference numerals in this and preceding Embodiments. The following description focuses on the differences of this Embodiment, from preceding Embodiments.

Figure 15:
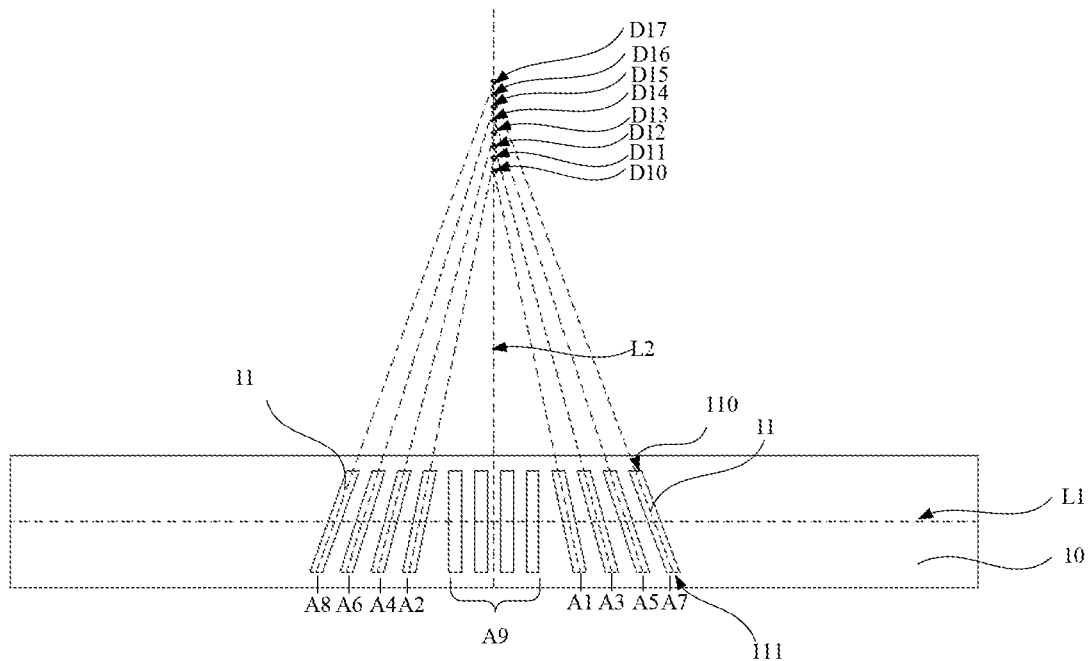

Driver Circuit Carrier: Referring to FIG. 15, a structural schematic of a driver circuit carrier according to Embodiment 8 of the present invention. As shown in FIG. 15, there are twelve first pins 11 divided into nine first-pin groups A1-A9. Each of the first-pin groups A1-A8 comprises one of the first pins 11, and the first-pin group A9 comprises four first pins 11. Along the first reference line L1 are arranged the first-pin group A8, the first-pin group A6, the first-pin group A4, the first-pin group A2, the first-pin group A9, the first-pin group A1, the first-pin group A3, the first-pin group A5 and the first-pin group A7 are sequentially arranged in order.

In this Embodiment, imaginary extending line of each of the first-pin groups A1-A8 intersects with a second reference line L2, while the first-pin group A9 extends parallel to the second reference line L2. Additionally, each first-pin group has its imaginary extending line intersecting the second reference line at different points. Specifically, the imaginary extending lines of the first-pin groups A1-A8 intersect with the second reference line L2 at the points D10-D17.

In this Embodiment, one of the first pins 11 close to the second reference line L2 may have its imaginary extending line intersecting with the second reference line L2 at a point close to the plurality of the first pins 11 (here, the plurality of the first pins 11 may be regarded as a whole). In other embodiments, it may be the case that one of the first pins 11 away from the second reference line L2 has its imaginary extending line intersecting with the second reference line L2 at a point close to the plurality of the first pins 11, or the case that at least some of the imaginary extending lines of the plurality of the first pins 11 cross one another.

Further, the angle between the imaginary extending line of one of the first pins 11 close to the second reference line L2 and the second reference line L2 may be smaller than, greater than or equal to the angle between the imaginary extending line of another one of the first pins 11 away from the second reference line L2 and the second reference line L2. Preferably, in a direction from one of the first pins closest to the second reference line to another one of the first pins farthest from the second reference line, each first pin has a greater angle between its imaginary extending line and the second reference line compared to a previous first pin.

In this Embodiment, the eight first-pin groups with their imaginary extending lines intersecting with the second reference line L2 are arranged evenly on both sides of the second reference line L2. On one side, the angle between the imaginary extending line of one of the first pins 11 close to the second reference line L2 and the second reference line L2 may be smaller than the angle between the imaginary extending line of another one of the first pins 11 away from the second reference line L2 and the second reference line L2, while on the other side, the angle between the imaginary extending line of one of the first pins 11 close to the second reference line L2 and the second reference line L2 may be equal to the angle between the imaginary extending line of another one of the first pins 11 away from the second reference line L2 and the second reference line L2. Alternatively, on both sides, the angle between the imaginary extending line of one of the first pins 11 close to the second reference line L2 and the second reference line L2 is smaller than the angle between the imaginary extending line of another one of the first pins 11 away from the second reference line L2 and the second reference line L2. The present application is not limited to this regard, and more choices are possible depending on the properties of the substrate 10.

Figure 16:
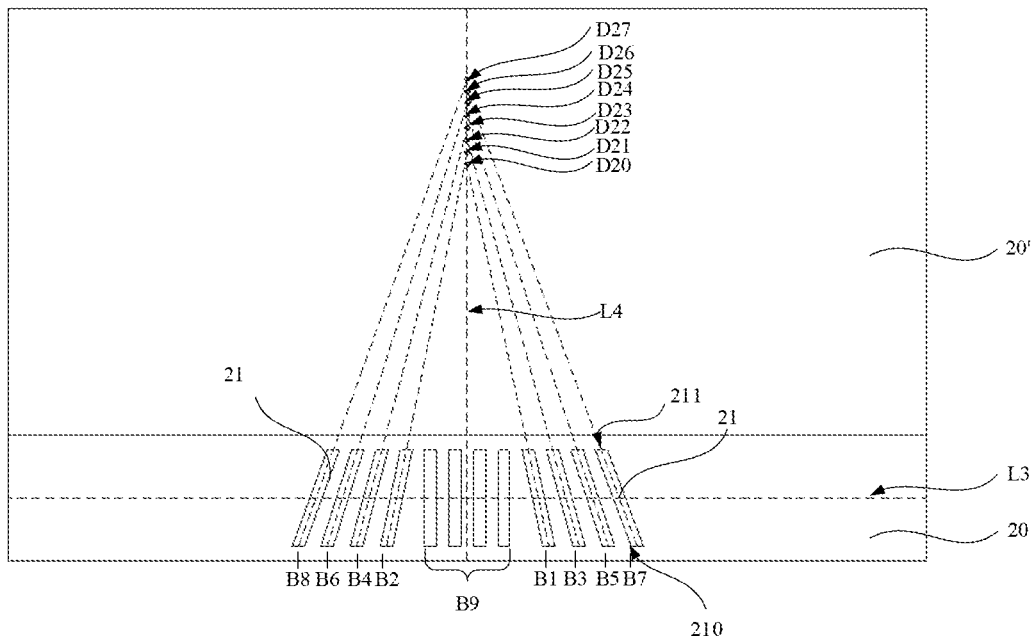

Display Panel: In this Embodiment, there is also provided a corresponding display panel. Specifically, reference is made to FIG. 16, a structural schematic of the display panel according to Embodiment 8. As shown in FIG. 16, the display panel 2 comprises a non-display area 20 in which a plurality of second pins 21 is arranged. The second pins 21 are provided in correspondence with the first pins 11. Reference can be made to the first pins 11 of this Embodiment and to Embodiment 1 for more details of the second pins 21, and a further detailed description of them is omitted.

Flat Panel Display Device: In this Embodiment, there is also provided a corresponding flat panel display device. With combined reference to FIGS. 15 and 16, in this Embodiment, the flat panel display device comprises a driver circuit carrier 1 and a display panel 2. The first pins 11 in the driver circuit carrier I are fully or partially bonded to the second pins 21 in the display panel 2 so that the second reference line L2 coincides with the fourth reference line L4.

Embodiment 9

Identical elements or elements performing identical functions are denoted by the same reference numerals in this and preceding Embodiments. The following description focuses on the differences of this Embodiment from preceding Embodiments.

Figure 17:
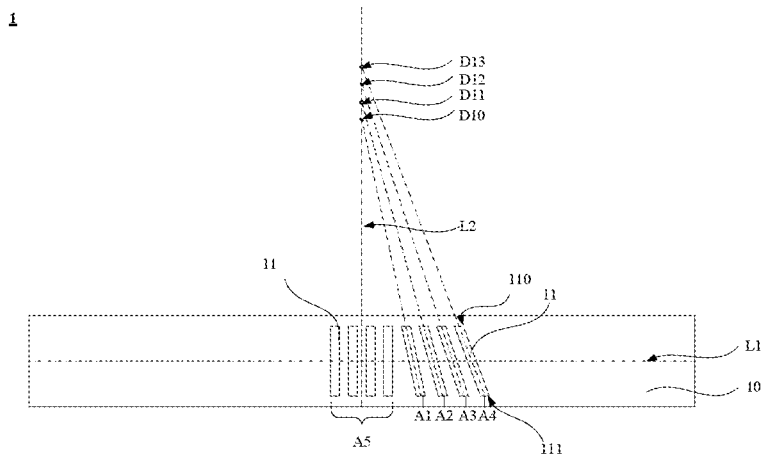

Driver Circuit Carrier: Referring to FIG. 17, a structural schematic of a driver circuit carrier according to Embodiment 9 of the present invention. As shown in FIG. 17, there are eight first pins 11 divided into five first-pin groups A1-A5. Each of the first-pin groups A1-A4 comprises one of the first pins 11, and the first-pin group A5 comprises four first pins 11. Along the first reference line L1 are arranged the first-pin group A5, the first-pin group A1, the first-pin group A2, the first-pin group A3 and the first-pin group A4 sequentially in this order. In this Embodiment, a second reference line L2 is situated in the first-pin group A5.

In this Embodiment, imaginary extending line of each of the first-pin groups A1-A4 intersects with the second reference line L2, while the first-pin group A5 extends parallel to the second reference line L2. Additionally, each first-pin group has an imaginary extending line intersecting with the second reference line L2 at respective different points. Specifically, the imaginary extending lines of the first-pin groups A1-A4 intersect with the second reference line L2 at the points D10-D13.

In this Embodiment, one of the first pins 11 close to the second reference line L2 may have its imaginary extending line intersecting with the second reference line L2 at a point close to the plurality of the first pins 11 (here, the plurality of the first pins 11 may be regarded as a whole). In other embodiments, it may be the case that one of the first pins 11 away from the second reference line L2 has its imaginary extending line intersecting with the second reference line L2 at a point close to the plurality of the first pins 11, or the case that at least some of the imaginary extending lines of the plurality of the first pins 11 cross one another.

Further, the angle between the imaginary extending line of one of the first pins 11 close to the second reference line L2 and the second reference line L2 may be smaller than, greater than or equal to the angle between the imaginary extending line of another one of the first pins 11 away from the second reference line L2 and the second reference line L2. Preferably, in a direction from one of the first pins closest to the second reference line to another one of the first pins farthest from the second reference line, the angle between an imaginary extending line of the first pin 11 and the second reference line L2 becomes larger.

Figure 18:
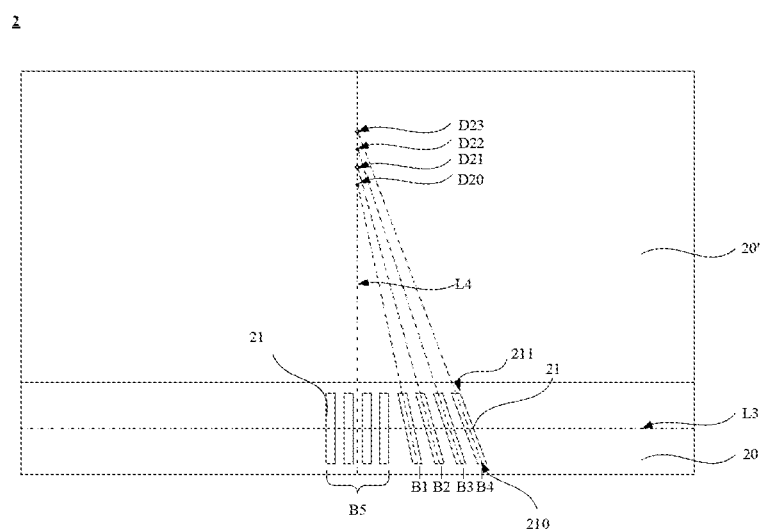

Display Panel: In this Embodiment, a corresponding display panel is provided. Specifically, reference is made to FIG. 18, a structural schematic of the display panel according to Embodiment 9. As shown in FIG. 18, the display panel 2 comprises a non-display area 20 in which a plurality of second pins 21 are arranged. The second pins 21 are provided in correspondence with the first pins 11. Reference can be made to the first pins 11 of this Embodiment and to Embodiment 1 for more details of the second pins 21, and a further detailed description of them is omitted.

Flat Panel Display Device: In this Embodiment, a corresponding flat panel display device is provided. In conjunction with FIGS. 17 and 18, in this Embodiment, the flat panel display device comprises a driver circuit carrier 1 and a display panel 2. The first pins 11 in the driver circuit carrier 1 are fully or partially bonded to the second pins 21 in the display panel 2 so that the second reference line L2 coincides with the fourth reference line L4.

Embodiment 10

Identical elements or elements performing identical functions are denoted by the same reference numerals in this and preceding Embodiments. The following description focuses on the differences of this Embodiment from preceding Embodiments.

Figure 19:
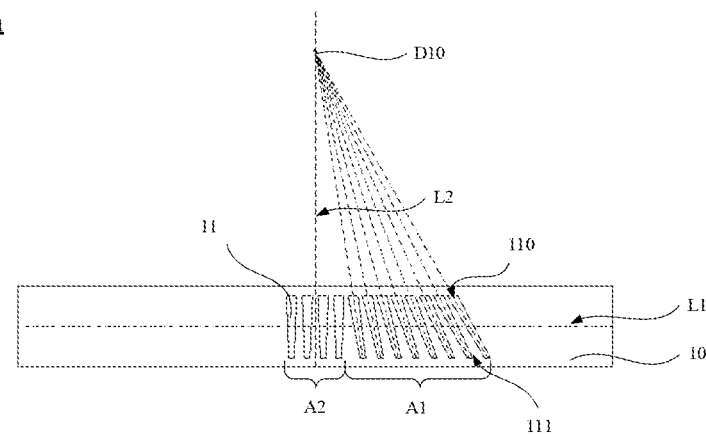

Driver Circuit Carrier: Reference is now made to FIG. 19, a structural schematic of a driver circuit carrier according to Embodiment 10 of the present invention. As shown in FIG. 19, each of the first pins 11 according to this Embodiment comprises a first end 110 and an opposite second end 111. Moreover, a cross-sectional width of each first pin 11 at the first end 110 is greater than a cross-sectional width thereof at the second end 111. The cross-sectional widths refer to those taken along the direction of the first reference line L1. For each of the first pins 11, the first end 110 is close to a display panel and the second end 111 is away from the display panel. During bonding the driver circuit carrier 1 to the display panel, the greater cross-section width of the first pins 11 at one end than at the other end can enhance bonding quality at the time of moving the driver circuit carrier to compensate the offset by providing greater contact areas between the pins on the driver circuit carrier 1 and pins on the display panel.

With continued reference to FIG. 19, in this Embodiment, the cross-sectional width of each first pin 11 gradually diminishes from the first end 110 toward the second end 111. That is, each first pin 11 has the greatest cross-sectional width at the first end 110 and the smallest cross-sectional width at the second end 111.

In other embodiments, each of the first pins 11 may have a different cross-sectional width design as long as each of them has a wider cross-section width at the first end 110 than at the second end 111. Specifically, each of the first pins 11 may have multiple sections differing from one another in terms of shapes and/or cross-sectional width.

Figure 20:
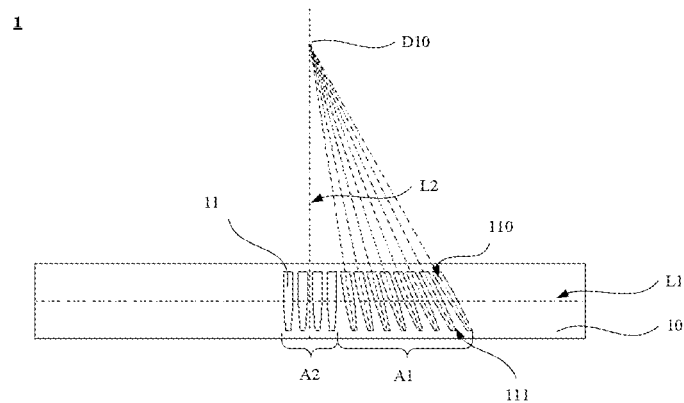

For example, as shown in FIG. 20, from the first end 110 to the second end 111, the cross-sectional width of each of the first pins 11 may first keep constant and then diminish gradually. In other words, each of the first pins 11 shown in FIG. 20 has two sections, i.e., a first section at the first end 110 and a second section away from the first end 110. The cross-sectional width of each of the first pins 11 is maintained constant throughout the first section and is equal to the cross-sectional width thereof at the first end 110. That is, the first section is formed into rectangle or parallelogram. However, in the second section, the cross-sectional width of each of the first pins 11 decreases gradually from the end close to the first end 110 to the second end 111. That is, in the second section, the cross-sectional width is greatest at the end close to the first end 110 and smallest at the second end 111.

As another example, from the first end 110 to the second end 111, the cross-sectional width of each of the first pins 11 may first diminish gradually, then keep constant, and finally again diminish gradually. In other words, each of the first pins 11 has three sections, i.e., a first section disposed at the first end 110, a third section disposed at the second end 111 and a second section disposed between the first section and the third section. In the first section, the cross-sectional width decreases gradually. That is, the cross-sectional width of each of the first pins 11 decreases from the first end 110. In other words, in the first section, the cross-sectional width of each of the first pins 11 is greatest at the first end 110 and smallest at the end away from the first end 110. In the second section, the cross-sectional width of each of the first pins remains constant and is equal to the smallest cross-sectional width in the first section and to the greatest cross-sectional width in the third section. That is, the second section is formed into rectangle or parallelogram. In the third section, the cross-sectional width of each of the first pins 11 gradually diminishes from the end proximal to the first end 110 to the second end 111. That is, in the third section, the cross-sectional width of each of the first pins 11 is greatest at the end proximal to the first end 110 and smallest at the second end 111.

As still another example, from the first end 110 to the second end 111, the cross-sectional width of each of the first pins 11 may first keep constant, then diminish, and finally again keep constant. In other words, each of the first pins 11 has two sections, i.e., a first section disposed at the first end 110 and a second section disposed away from the first end 110. The cross-sectional width of each of the first pins 11 is maintained constant throughout the first section and is equal to the cross-sectional width thereof at the first end 110. That is, the first section is formed into rectangle or parallelogram. In the second section, the cross-sectional width of each of the first pins 11 also remains constant and is equal to the cross-sectional width at the second end 111. That is, the second section is formed into rectangle or parallelogram. The cross-sectional width is smaller at the second end 111 than at the first end 110.

Figure 21:
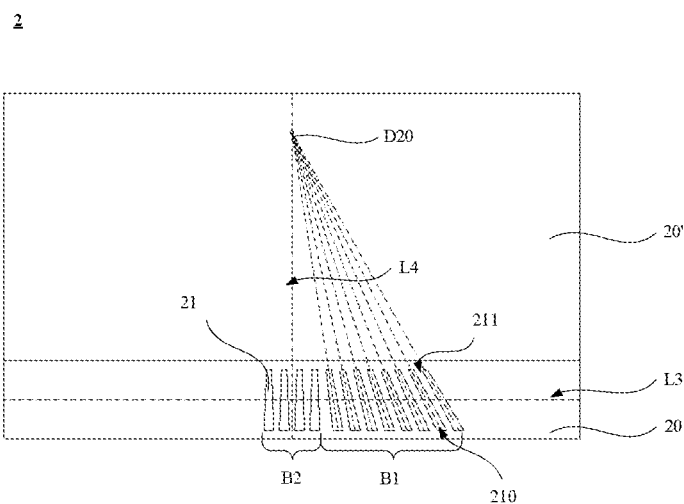
Figure 22:
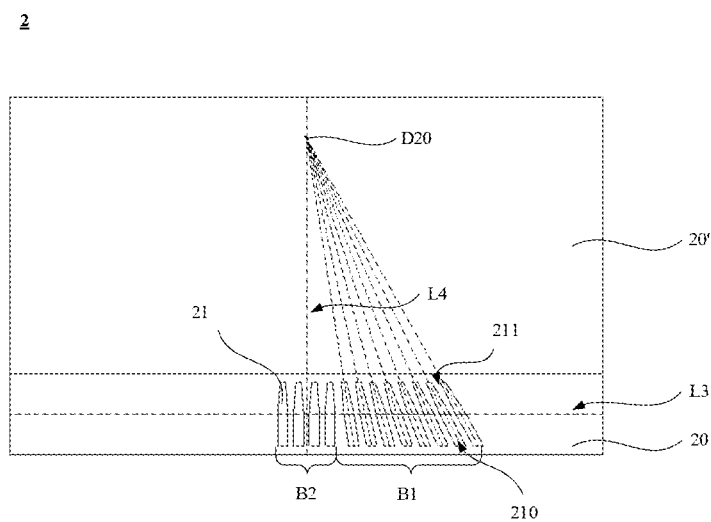

Display Panel: In this Embodiment, a corresponding display panel is provided. Specifically, FIG. 21 or 22 discloses a structural schematic of the display panel according to Embodiment 10. As shown in FIG. 21 or 22, the display panel 2 comprises a non-display area 20 in which a plurality of second pins 21 are arranged. The second pins 21 are provided in correspondence with the first pins 11. Reference can be made to the first pins 11 of this Embodiment and to Embodiment 1 for more details of the second pins 21, and a further detailed description of them is omitted.

Flat Panel Display Device: In this Embodiment, a corresponding flat panel display device is provided. In conjunction with FIGS. 19 to 22, in this Embodiment, the flat panel display device comprises a driver circuit carrier 1 and a display panel 2. The first pins 11 in the driver circuit carrier 1 are fully or partially bonded to the second pins 21 in the display panel 2 so that the second reference line L2 coincides with the fourth reference line L4.

Embodiment 11

Identical elements or elements performing identical functions are denoted by the same reference numerals in this and preceding Embodiments. The following description focuses on the differences of this Embodiment from preceding Embodiments.

Figure 23:
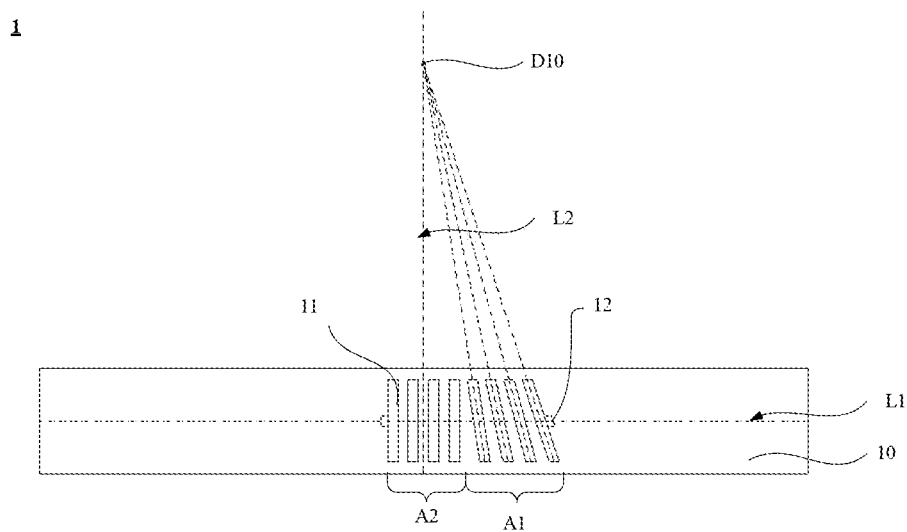

Reference is now made to FIG. 23, a structural schematic of a driver circuit carrier according to Embodiment 11 of the present invention. As shown in FIG. 23, in this Embodiment, a first alignment mark 12 is provided on an outermost one of first pins 11. The first alignment mark 12 can significantly facilitate alignment during the bonding of the driver circuit carrier 1 to a display panel and hence enhance bonding efficiency.

Preferably, first alignment marks 12 are provided on the respective two outermost ones of the first pins 11. With the first alignment marks 12 on multiple ones of the first pins 11, better alignment during the bonding of the driver circuit carrier 1 to the display panel can be achieved, resulting in an additional improvement in bonding efficiency.

In this Embodiment, each of the first pins 11 has a pair of first sides and a pair of second sides. The first sides both intersect with a first reference line L1, and the second sides both extend parallel to the first reference line L1. Preferably, each of the first alignment marks 12 is provided on an outer one of the first sides of the corresponding outermost first pins 11. Further, the first alignment marks 12 are located on the first reference line L1.

Furthermore, the first alignment marks 12 may assume a regular shape, such as a rectangular, trapezoidal, triangular, fan-shaped or circular shape, or an irregular shape, and the present application is not limited in this regard.

Figure 24:
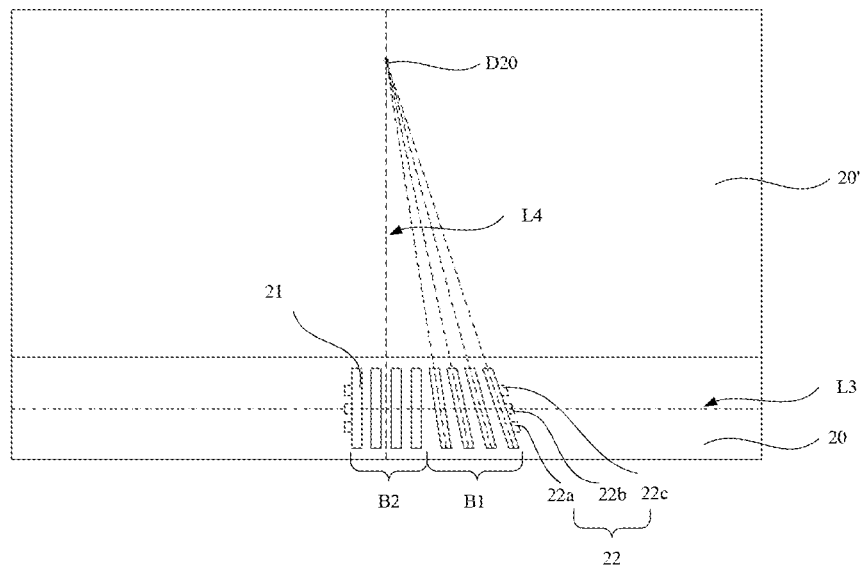

Display Panel: In this Embodiment, a corresponding display panel is provided. Specifically, FIG. 24 discloses a structural schematic of the display panel according to Embodiment 11. As shown in FIG. 24, the display panel 2 comprises a non-display area 20 in which a plurality of second pins 21 are arranged. In this Embodiment, a second alignment mark 22 is provided on an outermost one of the second pins 21. With the second alignment mark 22, alignment during the bonding of the driver circuit carrier 1 to the display panel 2 can be facilitated, resulting in enhanced bonding efficiency.

Preferably, second alignment marks 22 are provided on the respective two outermost ones of the second pins 21. With the second alignment marks 22 on multiple ones of the second pins 21, better alignment during the bonding of the driver circuit carrier 1 to the display panel can be achieved, resulting in an additional improvement in bonding efficiency.

In this Embodiment, each of the second pins 21 has a pair of third sides and a pair of fourth sides. The third sides both intersect with a third reference line L3, and the fourth sides both extend parallel to the third reference line L3. Preferably, each of second alignment marks 22 is provided on an outer one of the third sides of the corresponding outermost second pins 21.

Preferably, each of the second alignment marks 22 comprises a plurality of alignment structures that are identical or not in terms of shape or size. Further, each of the alignment structures may assume a regular shape, such as a rectangular, trapezoidal, triangular or circular shape, or an irregular shape, and the present application is not limited in this regard.

With continued reference to FIG. 24, in this Embodiment, each of the second alignment marks 22 comprises three alignment sections, respectively referred hereinafter to as, the alignment structure 22a, the alignment structure 22b and the alignment structure 22c. Among the three alignment structures, the alignment structure 22b is located on the third reference line L3, with the alignment structure 22a and the alignment structure 22c located on respective sides of the third reference line L3 and hence on respective sides of the alignment structure 22b. Moreover, the distances from the alignment structure 22a and the alignment structure 22c to the third reference line L3 are equidistant. The distances from the alignment structure 22a and the alignment structure 22c to the third reference line L3 refers to their distances therefrom in the direction of a fourth reference line L4.

Preferably, the distance from the alignment structure 22a to the third reference line L3, and hence the distance from the alignment structure 22c to the third reference line L3, satisfies:

$$H=h-s/w$$

H denotes the distances from the alignment structure 22a and the alignment structure 22c to the third reference line L3; h refers to the height of the second pin 21 (here, the plurality of the second pins 21 is regarded as a whole, and the height of each of the second pins 21 in the direction perpendicular to the third reference line L3); s is a constant (determined by a minimum area allowed by the used bonding material which is typically selected as an ACF material); and w refers to the cross-sectional width of the second pin 21 (either a cross-sectional width taken along the third reference line L3 or an average cross-sectional width of the second pin).

In other embodiments, each of the second alignment marks 22 may also comprise one or two alignment structures. In the former case, the single alignment structure is preferably located on the third reference line L3, while in the latter case, the two alignment structures are preferably located on respective sides of the third reference line L3 and equidistant with respect to the third reference line L3. Each of the second alignment marks 22 may also comprise more, for example, five or six alignment structures. In these cases, even more facilitated alignment during the bonding of the driver circuit carrier to the display panel 2 can be achieved, resulting in a further improvement in bonding efficiency.

Furthermore, the use of the second alignment marks 22 each including a plurality of alignment structures allows precise control over an offset compensation amount, thereby avoiding overcompensation or other issues.

Flat Panel Display Device: In this Embodiment, a corresponding flat panel display device is provided. In conjunction with FIGS. 23 and 24, in this Embodiment, the flat panel display device comprises a driver circuit carrier 1 and a display panel 2. The first pins 11 in the driver circuit carrier 1 are fully or partially bonded to the second pins 21 in the display panel 2 so that the second reference line L2 coincides with the fourth reference line L4.

Method of Making Flat Panel Display Device: In this Embodiment, a method for manufacturing a flat panel display device comprises the steps of: providing the driver circuit carrier 1; providing the display panel 2; aligning the first pins 11 in the driver circuit carrier 1 with the second pins 21 in the display panel 2 using the first alignment marks 12 in the driver circuit carrier 1 and the second alignment marks 22 in the display panel 2; and attaching the first pins 11 to the second pins 21 so that the driver circuit carrier 1 is bonded to the display panel 2.

Further, aligning the first pins 11 in the driver circuit carrier 1 with the second pins 21 in the display panel 2 by the first alignment marks 12 in the driver circuit carrier 1 and the second alignment marks 22 in the display panel 2 comprises: obtaining the distance between two of the first alignment marks 12 (in the direction of the first reference line L1) and the distance between two of the second alignment marks 22 (in the direction of the third reference line L3); obtaining a target offset from a difference of the distance between the two first alignment marks 12 from the distance between the two second alignment marks 22; moving the driver circuit carrier 1 along the second reference line L2 by a distance equal to the target offset so that the first pins 11 are aligned with the second pins 21. The target offset is derived according to:

$$Y=X/\tan\theta$$

Y denotes the target offset; X refers to the difference between the aforementioned distances; and θ refers to the angle between the imaginary extending line of the outermost first pin and the second reference line.

In this Embodiment, the target offset Y may be less than or equal to the distance H from the alignment structure 22a (or alignment structures 22c) to the third reference line. The target offset Y may also be zero. In this case, the distance that the driver circuit carrier 1 is moved along the second reference line L2 is also zero.

In the present application, eleven exemplary embodiments are presented for the purpose of illustration, based on which those skilled in the art can make various variants. For example, Embodiment 10 may be combined with Embodiment 5 by arranging the plurality of first pins 11 of Embodiment 10 in the same way as those of Embodiment 5; Embodiment 10 may also be combined with Embodiment 1; Embodiment 11 may be combined with Embodiment 5; Embodiment 11 may be combined with Embodiment 7; and so forth.

The description presented above is merely a few preferred embodiments of the present invention and does not limit the scope thereof in any sense. Any changes or modifications made by those skilled in the art based on the above teachings fall within the scope as defined in the appended claims.

What is claimed is:

1. A driver circuit carrier, bonded to a display panel, comprising:
   a substrate; and
   a plurality of first pins arranged on at least one surface of the substrate, the plurality of first pins arranged along a first reference line, an imaginary extending line of at least one of the first pins intersecting with a second reference line perpendicular to the first reference line, wherein the plurality of first pins are divided into a plurality of first-pin groups each comprising at least one of the first pins, for each of the first-pin groups having the imaginary extending line intersecting the second reference line, each first pin intersects with the second reference line at a same point, for each of the first-pin groups extending parallel to the second reference line, each first pin extends parallel to the second reference line or coincides with the second reference line, an overall shape of a layout of the first pins appears like a trapezoid having a shorter base close to the display panel and a longer base away from the display panel, and each of the first pins comprises a first end close to the shorter base of the trapezoid and a second end opposite to the first end, a cross-sectional width of the first end being greater than that of the second end.

2. The driver circuit carrier of claim 1, wherein the cross-sectional width diminishes from the first end toward the second end.

3. The driver circuit carrier of claim 1, wherein each of the first pins comprises multiple sections differing from one another in terms of shape and/or cross-sectional width.

4. The driver circuit carrier of claim 1, wherein in each of the first-pin groups, the cross-sectional widths of the first pins being larger from the first pin close to a middle of the plurality of the first pins, to the first pins close to lateral sides of the plurality of the first pins.

5. The driver circuit carrier of claim 4, wherein all of the imaginary extending lines intersect with the second reference line at a same point, or all of the imaginary extending lines intersect with the second reference line at different points, or some of the imaginary extending lines intersect with the second reference line at a same point.

6. The driver circuit carrier of claim 5, wherein:
   in one first-pin group and along a direction from one of the first pins closest to the second reference line to another one of the first pins farthest from the second reference line, each first pin has a same increment in an angle between its imaginary extending line and the second reference line; and/or
   among those of the first-pin groups having their imaginary extending lines intersecting with the second reference line, along a direction from one of the first-pin groups closest to the second reference line to another one of the first-pin groups farthest from the second reference line, each first-pin group has a greater increment in the angles between the imaginary extending lines of the corresponding first pins and the second reference line.

7. The driver circuit carrier of claim 5, wherein in each of the first-pin groups, first pins have a same cross-sectional width taken along the first reference line.

8. The driver circuit carrier of claim 5, wherein in one first-pin group, adjacent first pins are spaced apart equidistantly along the first reference line.

9. The driver circuit carrier of claim 5, wherein among all the first-pin groups, along a direction from one of the first-pin groups closest to the second reference line to another one of the first-pin groups farthest from the second reference line, each first-pin group has a greater spacing between adjacent first pins along the first reference line compared to a previous first-pin group.

10. The driver circuit carrier of claim 1, wherein:
    one or two outermost ones of the first pins are respectively provided with a regular or irregular shaped first alignment mark;
    each of the first pins comprises a pair of first sides and a pair of second sides, the first sides intersecting with the first reference line, the second sides extending parallel to the first reference line;
    each first alignment mark is provided on an outer one of the first sides of the corresponding outermost first pin; and
    each of the first pins is bisected, along the second reference line, by the first reference line into two halves, the first alignment mark being located on the first reference line.

11. A display panel, for bonding to the driver circuit carrier as defined in claim 1, wherein the display panel comprises a non-display area in which there is a plurality of second pins arranged along a third reference line, an imaginary extending line of at least one of the second pins intersects with a fourth reference line perpendicular to the third reference line, and an arrangement of the second pins in the display panel with respect to the third and fourth reference lines corresponds to an arrangement of the first pins in the driver circuit carrier with respect to the first and second reference lines.

12. The display panel of claim 11, wherein:
    one or two outermost ones of the second pins are respectively provided with a second alignment mark;
    each of the second pins comprises a pair of third sides and a pair of fourth sides, the third sides intersecting with the third reference line, the fourth sides extending parallel to the third reference line;
    each second alignment mark is provided on an outer third side of the corresponding outermost second pin; and
    each of the second pins is bisected, along the fourth reference line, by the third reference line into two halves, and each second alignment mark comprises three alignment structures, and wherein one of the alignment structures is located on the third reference line, and the other two of the alignment structures are located on respective sides of the third reference line and equidistant from the third reference line.

13. A method for manufacturing a flat panel display device, comprising:
providing the driver circuit carrier as defined in claim 10;
providing the display panel, for bonding to the driver circuit carrier,
the driver circuit carrier comprising the substrate; and the plurality of first pins arranged on at least one surface of the substrate, the plurality of first pins arranged along the first reference line, the imaginary extending line of at least one of the first pins intersecting with a second reference line perpendicular to the first reference line,
wherein the display panel comprises a non-display area in which there is a plurality of second pins arranged along a third reference line, an imaginary extending line of at least one of the second pins intersects with a fourth reference line perpendicular to the third reference line, and an arrangement of the second pins in the display panel with respect to the third and fourth reference lines corresponds to an arrangement of the first pins in the driver circuit carrier with respect to the first and second reference lines,
wherein one or two outermost ones of the second pins are respectively provided with a second alignment mark,
each of the second pins comprises a pair of third sides and a pair of fourth sides, the third sides intersecting with the third reference line, the fourth sides extending parallel to the third reference line,
each second alignment mark is provided on an outer third side of the corresponding outermost second pin, and
each of the second pins is bisected, along the fourth reference line, by the third reference line into two halves, and each second alignment mark comprises three alignment structures, and wherein one of the alignment structures is located on the third reference line, and the other two of the alignment structures are located on respective sides of the third reference line and equidistant from the third reference line;

aligning the first pins in the driver circuit carrier with the second pins in the display panel by the first alignment marks in the driver circuit carrier and the second alignment marks in the display panel; and attaching the first pins to the second pins to bond the driver circuit carrier onto the display panel.

14. The method for manufacturing the flat panel display device of claim 13, wherein the aligning the first pins in the driver circuit carrier with the second pins in the display panel by the first alignment marks in the driver circuit carrier and the second alignment marks in the display panel, comprises: obtaining a distance between the two first alignment marks and a distance between the two second alignment marks; obtaining a target offset from a difference between the distance between the two first alignment marks and the distance between the two second alignment marks; moving the driver circuit carrier along the second reference line by a distance equal to the target offset to align the first pins with the second pins.

15. The method for manufacturing the flat panel display device of claim 14, wherein the target offset is derived according to: $Y=X/\tan\theta$ wherein Y denotes the target offset; X denotes the difference between the distances; and $\theta$ denotes an angle between an imaginary extending line of the outermost first pin and the second reference line.

* * * * *